US012362018B2

(12) United States Patent
Lee

(10) Patent No.: US 12,362,018 B2
(45) Date of Patent: Jul. 15, 2025

(54) METHOD OF PROGRAMMING MEMORY

(71) Applicant: MACRONIX International Co., Ltd., Hsinchu (TW)

(72) Inventor: Ya-Jui Lee, Taichung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 199 days.

(21) Appl. No.: 18/452,563

(22) Filed: Aug. 21, 2023

(65) Prior Publication Data

US 2025/0069661 A1    Feb. 27, 2025

(51) Int. Cl.
| | | |
|---|---|---|
| *G11C 16/04* | (2006.01) | |
| *G11C 16/08* | (2006.01) | |
| *G11C 16/10* | (2006.01) | |
| *G11C 16/24* | (2006.01) | |
| *H10B 43/27* | (2023.01) | |
| *H10B 43/35* | (2023.01) | |

(52) U.S. Cl.
CPC .............. *G11C 16/10* (2013.01); *G11C 16/08* (2013.01); *G11C 16/24* (2013.01); *H10B 43/27* (2023.02); *H10B 43/35* (2023.02); *G11C 16/0483* (2013.01)

(58) Field of Classification Search
CPC .................................................. G11C 16/0425
See application file for complete search history.

(56) References Cited

U.S. PATENT DOCUMENTS

| | | | |
|---|---|---|---|
| 10,614,891 B2 | 4/2020 | Park et al. | |
| 11,348,641 B2 | 5/2022 | Shin et al. | |
| 2009/0168531 A1* | 7/2009 | Shirota | G11C 16/3418 365/185.15 |
| 2023/0015493 A1 | 1/2023 | Jung et al. | |
| 2023/0145117 A1 | 5/2023 | Kim et al. | |

FOREIGN PATENT DOCUMENTS

| | | |
|---|---|---|
| CN | 109427397 | 3/2019 |
| CN | 112825252 | 5/2021 |
| CN | 115620787 | 1/2023 |
| CN | 116110478 | 5/2023 |

OTHER PUBLICATIONS

"Office Action of Taiwan Counterpart Application", issued on May 14, 2024, p. 1-p. 7.

* cited by examiner

*Primary Examiner* — Jason Lappas
(74) *Attorney, Agent, or Firm* — J.C. PATENTS

(57) ABSTRACT

A method of programming a memory includes performing a plurality of programming shots is provided. Each programming shot includes a pre-charge stage and a programming stage and includes the following steps. Applying a common source line voltage to a common source line or applying a bit line voltage to a bit line in the pre-charge stage, wherein the common source line voltage or the bit line voltage is applied by using incremental-step-pulse programming (ISSP) in the plurality of pre-charge stages. Applying a programming voltage to a selected word line in the programming stage, wherein the programming voltage is applied by using ISSP in the plurality of programming stages.

20 Claims, 17 Drawing Sheets

METHOD OF PROGRAMMING MEMORY

BACKGROUND

Technical Field

The disclosure relates to an operating method of a semiconductor device. In particular, the disclosure relates to a method of programming a memory.

Description of Related Art

During a programming operation including a plurality of programming shots on a memory, a specific common source line voltage may first be applied to a common source line in a pre-charge stage of the programming shots to increase a channel potential of an unselected memory cell to a sufficiently large voltage level, accordingly preventing generation of the Fowler-Nordheim (FN) tunneling effect in the unselected memory cell. However, an excessively large common source line voltage is likely to generate a relatively large horizontal electric field on a specific word line (e.g., a selected word line) and induce hot carrier disturbance, increasing the threshold voltage of the unselected memory cell and increasing the likelihood of read disturbance generated during subsequent read operations.

If the common source line voltage applied to the common source line in the pre-charge stage is reduced to address to the above issues, the ability of preventing programming disturbance of the unselected memory cell may be reduced due to a reduction in the channel potential, increasing the likelihood that the unselected memory cell is subjected to programming disturbance.

SUMMARY

The disclosure provides a method of programming a memory, wherein induction of hot carrier disturbance may be prevented and the likelihood of memory programming disturbance may be reduced.

According to an embodiment of the disclosure, a method of programming a memory includes performing a plurality of programming shots is provided. Each programming shot includes a pre-charge stage and a programming stage and includes the following steps. Applying a common source line voltage to a common source line, wherein the common source line voltage is applied by using incremental-step-pulse programming (ISSP) in the plurality of pre-charge stages. Applying a programming voltage to a selected word line in the programming stage, wherein the programming voltage is applied by using ISSP in the plurality of programming stages.

According to another embodiment of the disclosure, a method of programming a memory includes performing a plurality of programming shots is provided. Each programming shot includes a pre-charge stage and a programming stage and includes the following steps. Applying a bit line voltage to a bit line in the pre-charge stage, wherein the bit line voltage is applied by using incremental-step-pulse programming (ISSP) in the plurality of pre-charge stages. Applying a programming voltage to a selected word line in the programming stage, wherein the programming voltage is applied by using ISSP in the plurality of programming stages.

Based on the foregoing, in the method of programming a memory of the embodiment of the disclosure, by applying the common source line voltage to the common source line or applying the bit line voltage to the bit line using incremental-step-pulse programming in the plurality of pre-charge stages, which could prevent generation of a relatively large horizontal electric field on a specific word line (e.g., the selected word line) and induction of hot carrier disturbance. Furthermore, by applying the common source line voltage to the common source line or applying the bit line voltage to the bit line using incremental-step-pulse programming in the plurality of pre-charge stages, which could reduce the likelihood of programming disturbance generated in the memory of the embodiment of the disclosure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
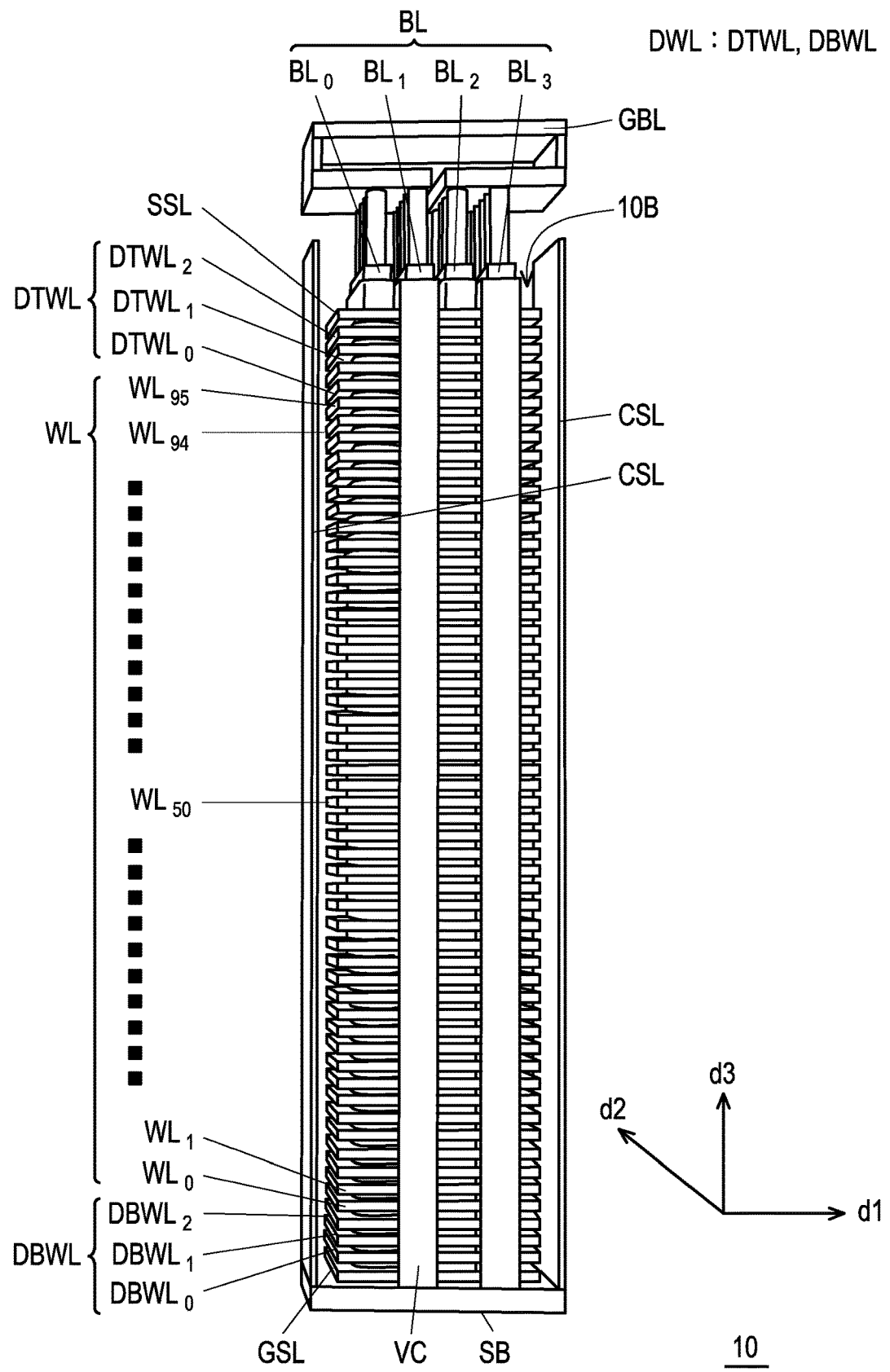
FIG. 1A shows a schematic partial perspective view of a memory of an embodiment of the disclosure.
Figure 1B:
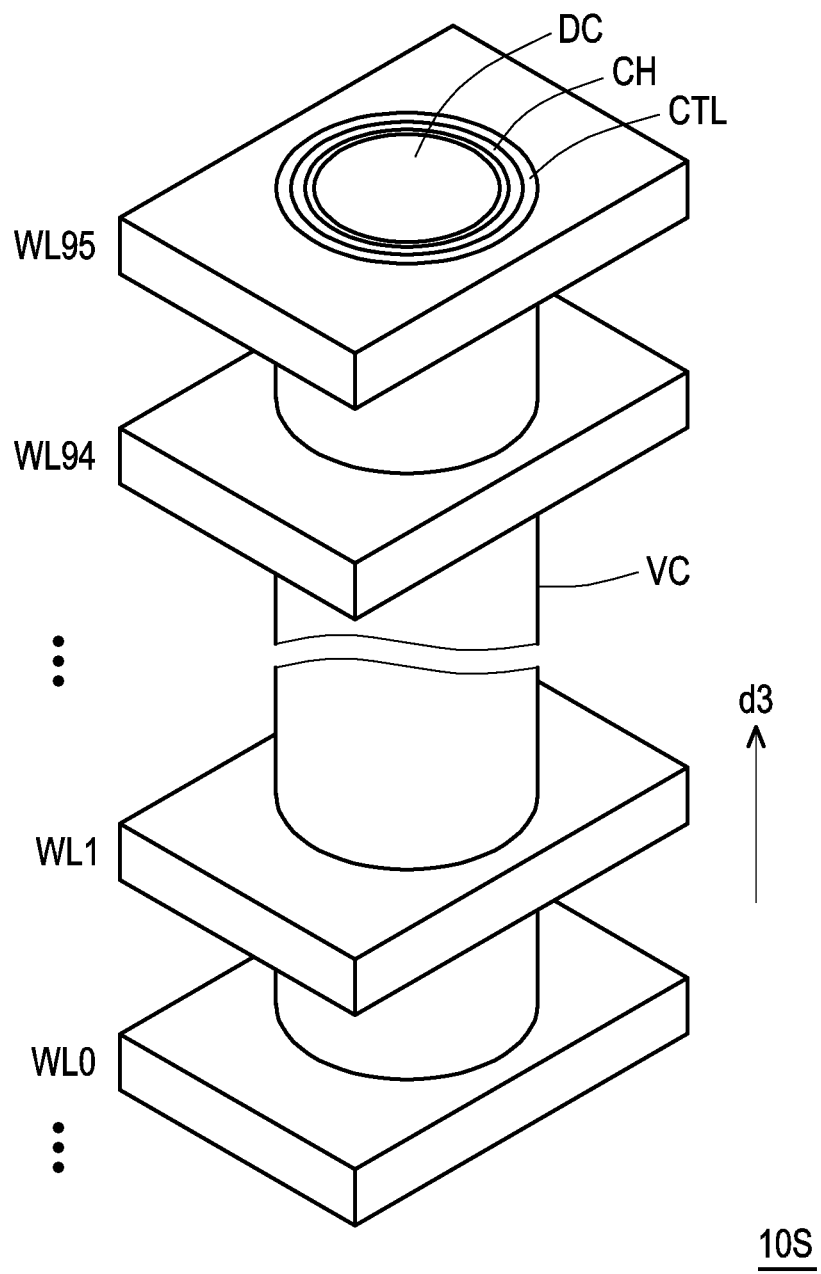
FIG. 1B shows a schematic partial perspective view of a cell string of an embodiment in the memory of FIG. 1A.

FIG. 1A shows a schematic partial perspective view of a memory of an embodiment of the disclosure, and FIG. 1B shows a schematic partial perspective view of a cell string of an embodiment in the memory of FIG. 1A.

With reference to FIG. 1A and FIG. 1B together, in this embodiment, a memory 10 includes a substrate SB, a common source line CSL, a word line stack WL, a dummy word line stack DWL, a string select line SSL, a ground select line GSL, a plurality of vertical channel structures VC, a plurality of bit lines BL, and a global bit line GBL. The memory 10 may be a three-dimensional memory, for example, and may be a three-dimensional NAND flash memory, for example, but the disclosure is not limited thereto.

The substrate SB may be a semiconductor substrate, for example. In some embodiments, the material of the substrate SB may include silicon, doped silicon, germanium, silicon germanium, semiconductor compounds, other suitable semiconductor materials, or a combination thereof. For example, the substrate SB may be a silicon substrate, but the disclosure is not limited thereto. In some embodiments, a plurality of doped regions may be formed in the substrate SB depending on design requirements. For example, a plurality of doped regions including a P-type well region (not shown) and an N-type deep well region (not shown) may be formed in the substrate SB, but the disclosure is not limited thereto. In other embodiments, a buried oxide layer (not shown) may further be formed on the substrate SB.

The common source line CSL is disposed on the substrate SB, for example, and may be in a form of a conductive layer or a plurality of conductive lines disposed on the substrate SB, and the disclosure is not limited thereto. In this embodiment, the common source line CSL further extends in a normal direction d3 of the substrate SB to define a memory block 10B of the memory 10. To be specific, in this embodiment, the memory 10 may further include a plurality of memory blocks and a plurality of common source lines not shown in FIG. 1A, and the memory blocks are defined by two common source lines adjacent to each other.

The plurality of vertical channel structures VC are disposed on the substrate SB and electrically connected to the common source line CSL, for example. Each of the plurality of vertical channel structures VC extends in the normal direction d3 of the substrate SB, for example. In some embodiments, the plurality of vertical channel structures VC are disposed in the memory block 10B defined by two adjacent common source lines. In other words, the plurality of vertical channel structures VC may be disposed between adjacent common source lines.

One of the plurality of vertical channel structures VC includes a cell string 10S as shown in FIG. 1B, but the disclosure is not limited thereto. In this embodiment, each of the plurality of vertical channel structures VC may include an insulating column DC, a channel layer CH, and a charge trap layer CTL, but the disclosure is not limited thereto.

The insulating column DC is the internal structure of the vertical channel structure VC, for example. In some embodiments, the material of the insulating column DC may include a suitable dielectric material. For example, the material of the insulating column DC may include silicon oxide, but the disclosure is not limited thereto.

The channel layer CH is disposed around the insulating column DC, for example. In some embodiments, the channel layer CH may include a suitable semiconductor material. For example, the material of the channel layer CH may include polycrystalline silicon, but the disclosure is not limited thereto.

The charge trap layer CTL is disposed around the channel layer CH, for example, and may be the external structure of the vertical channel structure VC, for example. In some embodiments, the charge trap layer CTL may include a composite structure. In this embodiment, the charge trap layer CTL may include three dielectric layers sequentially stacked on the side surface of the channel layer CH. For example, the charge trap layer CTL may include an oxide-nitride-oxide (ONO) composite layer, but the disclosure is not limited thereto. In other embodiments, the charge trap layer CTL may include an oxide-nitride-oxide-nitride-oxide (ONONO) composite layer or a composite layer including other structures.

The word line stack WL is disposed on the substrate SB, for example. In some embodiments, the word line stack WL may include a plurality of word lines sequentially stacked in the normal direction d3 of the substrate SB. The plurality of word lines may each extend on a plane defined by a first direction d1 and a second direction d2, and the first direction d1 and the second direction d2 are orthogonal to the normal direction d3 of the substrate SB. To be specific, the plurality of word lines included in the word line stack WL may each be regarded as one layer of memory cell page, and the memory block 10B includes a plurality of layers of memory cell pages. In this embodiment, the word line stack WL includes 96 word lines $WL_0$-$WL_{95}$, and memory cells in one of the cell strings 10S are electrically connected to the corresponding word lines, but the disclosure is not limited thereto. In some embodiments, the material of the word line stack WL may include a suitable conductive material. For example, the material of the word line stack WL may include tungsten, but the disclosure is not limited thereto.

The dummy word line stack DWL is disposed on the substrate SB, for example, and may include a bottom dummy word line stack DBWL and a top dummy word line stack DTWL. In some embodiments, the bottom dummy word line stack DBWL may include a plurality of bottom dummy word lines sequentially stacked in the normal direction d3 of the substrate SB, and the top dummy word line stack DTWL may also include a plurality of top dummy word lines sequentially stacked in the normal direction d3 of the substrate SB. The plurality of bottom dummy word lines and the plurality of top dummy word lines may also each extend on a plane defined by the first direction d1 and the second direction d2. In this embodiment, the bottom dummy word line stack DBWL includes 3 bottom dummy word lines $DBWL_0$-$DBWL_2$, and the top dummy word line stack DTWL also includes 3 top dummy word lines $DTWL_0$-$DTWL_2$, but the disclosure is not limited thereto. In some embodiments, the material of the dummy word line stack DWL may be the same or similar to the material of the word line stack WL.

In this embodiment, the plurality of bottom dummy word lines $DBWL_0$-$DBWL_2$ are disposed between the substrate SB and the plurality of word lines $WL_0$-$WL_{95}$ in the normal direction d3 of the substrate SB. From another perspective, the plurality of word lines $WL_0$-$WL_{95}$ are disposed between the plurality of bottom dummy word lines $DBWL_0$-$DBWL_2$ and the plurality of top dummy word lines $DTWL_0$-$DTWL_2$ in the normal direction d3 of the substrate SB.

The string select line SSL is disposed on the substrate SB, for example. In some embodiments, the string select line SSL may be disposed on the plurality of top dummy word lines $DTWL_0$-$DTWL_2$ in the normal direction d3 of the substrate SB. In some embodiments, the material of the string select line SSL may be the same or similar to the material of the word line stack WL. It is worth noting that, although FIG. 1A shows that the number of string select lines SSL included in the memory 10 is one, the disclosure is not limited thereto.

The ground select line GSL is disposed on the substrate SB, for example. In some embodiments, the ground select line GSL may be disposed between the plurality of bottom dummy word lines $DBWL_0$-$DBWL_2$ and the substrate SB in the normal direction d3 of the substrate SB. In some embodiments, the material of the ground select line GSL may be the same or similar to the material of the word line stack WL.

The plurality of bit lines BL are disposed on the substrate SB, for example, and the plurality of bit lines BL may each extend in the second direction d2. In some embodiments, the plurality of bit lines BL are disposed on the vertical channel structures VC in the normal direction d3 of the substrate SB. It is worth noting that, although FIG. 1A shows that the plurality of bit lines BL in the memory 10 include 4 bit lines $BL_0$-$BL_3$, the disclosure is not limited thereto. In addition, in this embodiment, the corresponding bit line (e.g., the bit lines $BL_0$-$BL_3$) may be electrically connected to the channel layer CH in the corresponding vertical channel structure VC through a conductive structure (not shown) such as a plug. Based on this, the cell strings 10S in the memory block 10B may be electrically connected between the common source line CSL and the corresponding bit line (e.g., the bit lines $BL_0$-$BL_3$). In some embodiments, the material of the plurality of bit lines BL may be the same or similar to the material of the word line stack WL.

The global bit line GBL is disposed on the substrate SB, for example. In some embodiments, the global bit line GBL may be electrically connected to the plurality of bit lines BL. In this embodiment, the global bit line GBL may be electrically connected to the bit lines $BL_0$-$BL_3$. In some embodiments, the material of the global bit line GBL may be the same or similar to the material of the word line stack WL.

Figure 2A:
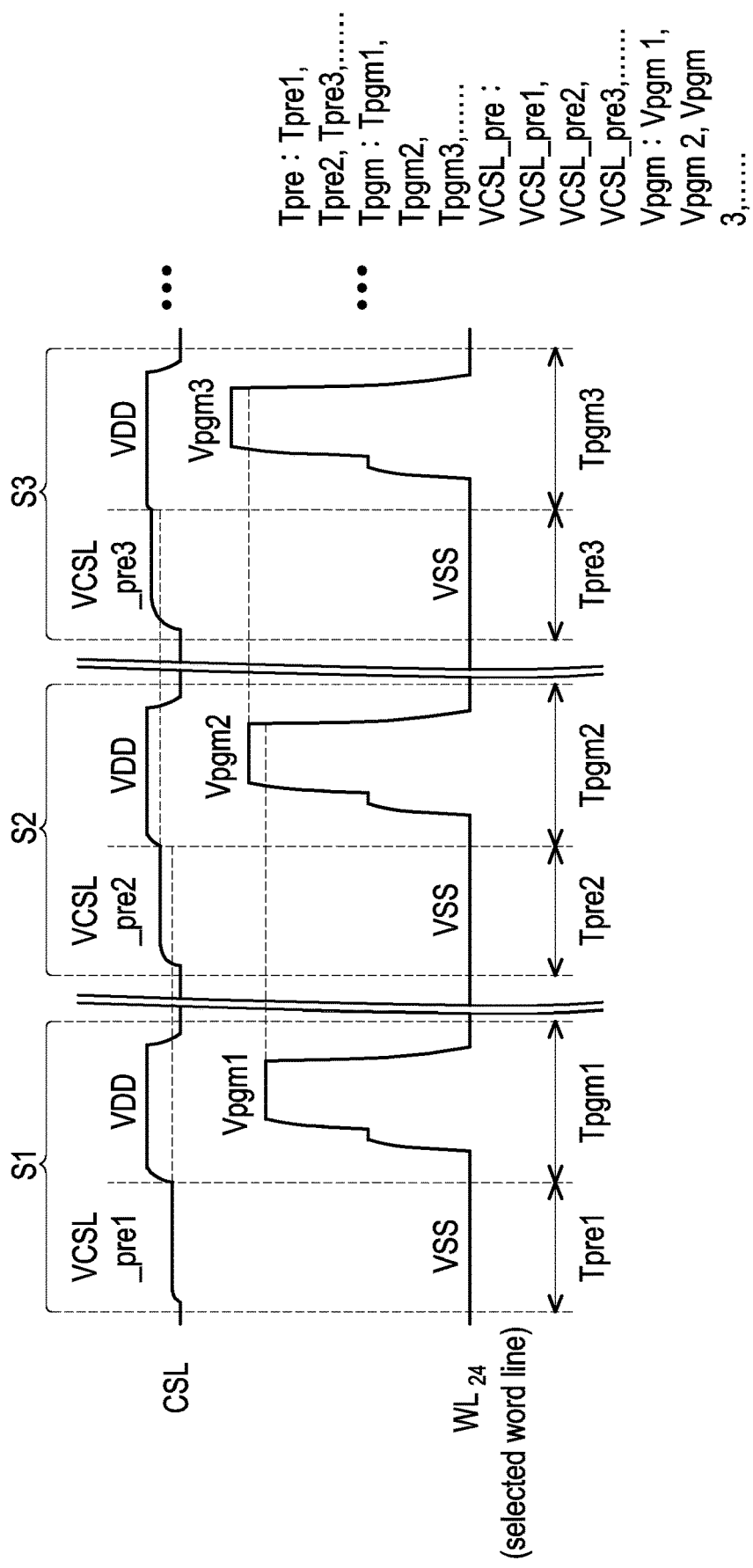
FIGS. 2A and 2B show a voltage waveform diagram of a memory performing a programming operation of an embodiment of the disclosure.
Figure 2B:
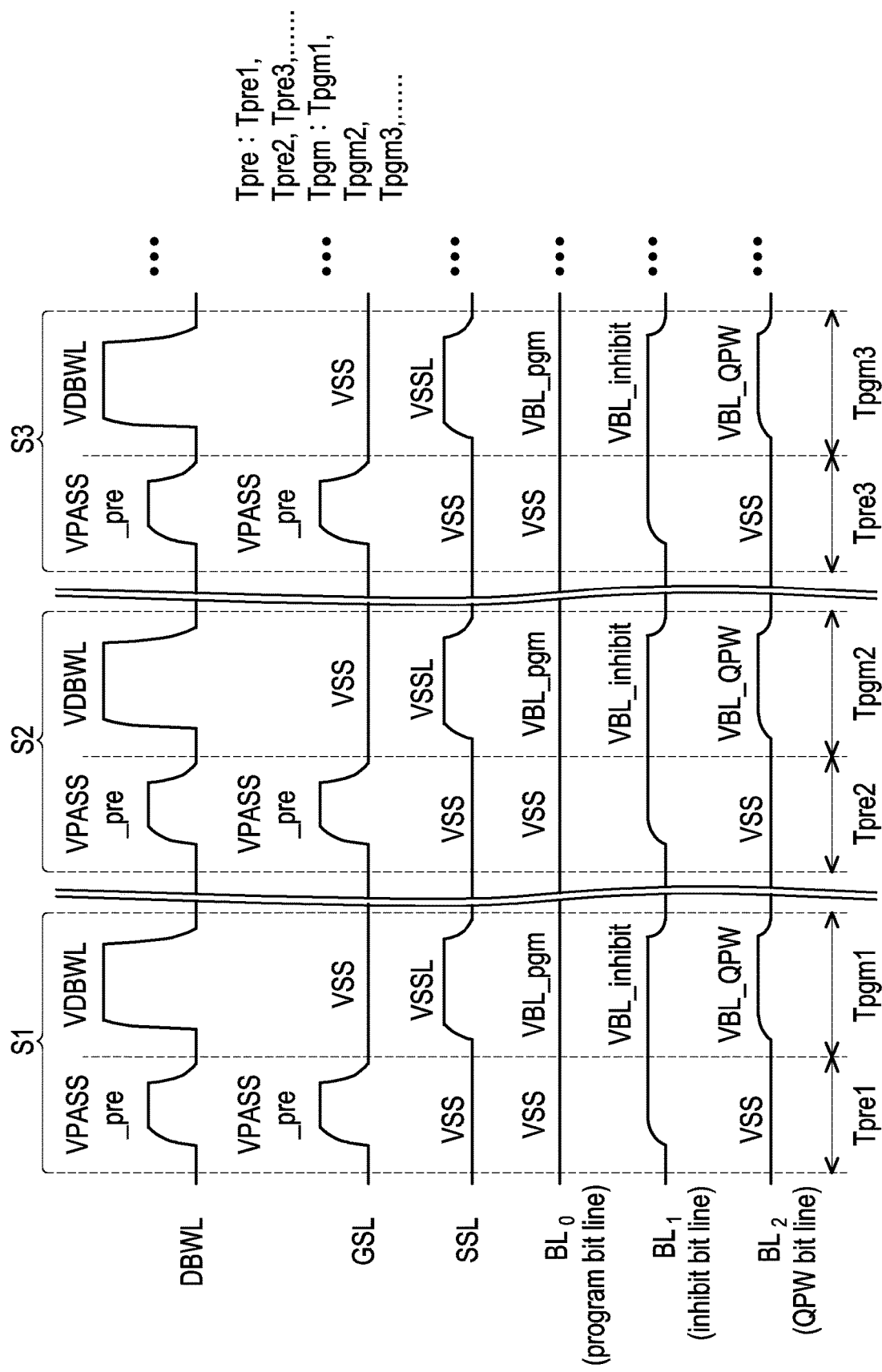
Figure 3:
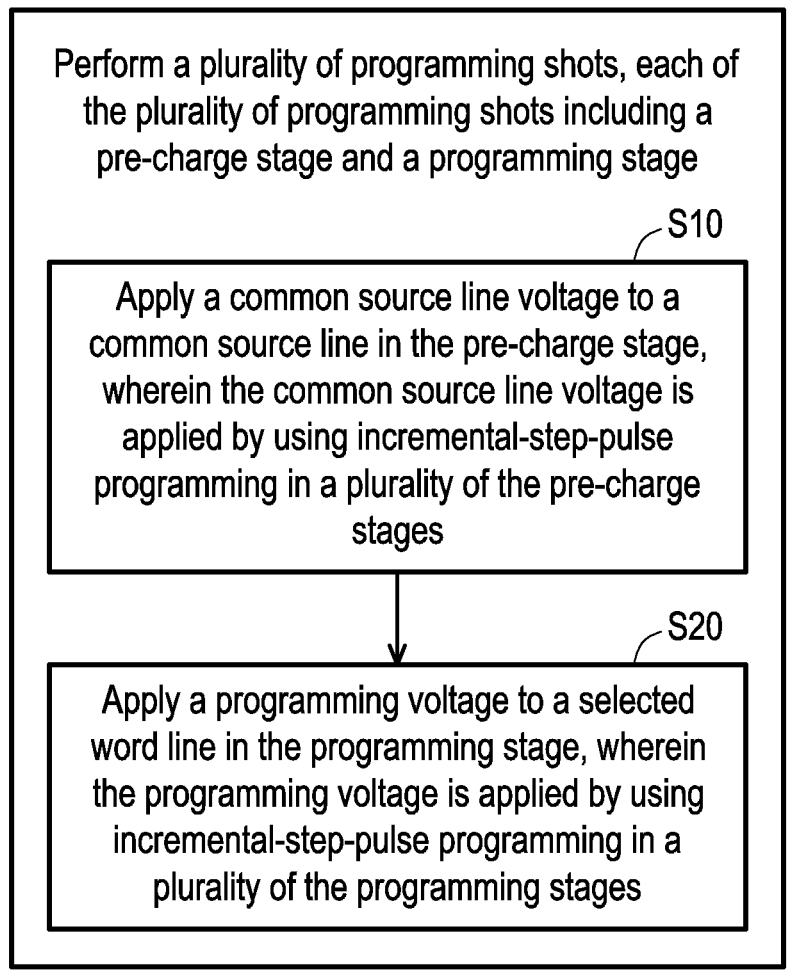
FIG. 3 shows a flowchart of a method of programming a memory of an embodiment of the disclosure.

FIGS. 2A and 2B show a voltage waveform diagram of a memory performing a programming operation of an embodiment of the disclosure, and FIG. 3 shows a flowchart of a method of programming a memory of an embodiment of the disclosure. The memory 10 is taken as an example of the memory illustrated in FIG. 3, but it should be noted that the disclosure is not limited thereto.

With reference to FIG. 2A and FIG. 3 together, to be described firstly, in this embodiment, a programming operation including a plurality of programming shots is performed on the memory 10, and a programming operation including 15 programming shots performed on the memory 10 is taken as an example, but the disclosure is not limited thereto. In addition, although not shown in FIG. 3, a programming verification may be performed between two programming shots.

It is worth noting that, in this embodiment, although the programming operation is performed taking a sequence from the top of the memory 10 to the bottom of the memory 10 (the word line $WL_{95}$ to the word line $WL_0$) as an example, the disclosure is not limited thereto. In other words, in other embodiments, the programming operation may be performed in a sequence from the bottom of the memory 10 to the top of the memory 10 (the word line $WL_0$ to the word line $WL_{95}$).

In step S10, a common source line voltage VCSL_pre is applied to the common source line CSL in a pre-charge stage Tpre, and the common source line voltage VCSL_pre is applied by using incremental-step-pulse programming (ISPP) in the pre-charge stages Tpre of the plurality of programming shots. For example, as shown in FIG. 2A, a common source line voltage VCSL_pre1 is applied to the common source line CSL in a pre-charge stage Tpre1 of a first programming shot S1, a common source line voltage VCSL_pre2 is applied to the common source line CSL in a pre-charge stage Tpre2 of a second programming shot S2, and a common source line voltage VCSL_pre3 is applied to the common source line CSL in a pre-charge stage Tpre3 of a third programming shot S3. The common source line voltage VCSL_pre1 is less than or equal to the common source line voltage VCSL_pre2, and the common source line voltage VCSL_pre2 is less than or equal to the common source line voltage VCSL_pre3 (VCSL_pre1≤VCSL_pre2≤VCSL_pre3).

In this embodiment, the common source line voltages VCSL_pre applied in the pre-charge stages Tpre of the 15 programming shots may be as shown in Table 1 below and would be described below, but the disclosure is not limited thereto.

TABLE 1

Forms of common source line voltages applied in pre-charge stages

| Programming shot | Embodiment 1 | Embodiment 2 | Embodiment 3 | Embodiment 4 | Embodiment 5 |
|---|---|---|---|---|---|
| S1 | 1 V | 1 V | 1 V | 1 V | 1 V |
| S2 | 1.1 V | 1 V | 1 V | 1 V | 1 V |
| S3 | 1.2 V | 1 V | 1 V | 1 V | 1 V |
| S4 | 1.3 V | 1 V | 1 V | 1.2 V | 1 V |
| S5 | 1.4 V | 1 V | 1 V | 1.2 V | 1 V |
| S6 | 1.5 V | 1 V | 1 V | 1.2 V | 1 V |
| S7 | 1.6 V | 1 V | 1 V | 1.4 V | 1 V |
| S8 | 1.7 V | 1 V | 1 V | 1.4 V | 1 V |
| S9 | 1.8 V | 1 V | 1 V | 1.4 V | 1 V |
| S10 | 1.9 V | 1 V | 1 V | 1.6 V | 1 V |
| S11 | 2.0 V | 1.1 V | 1.3 V | 1.6 V | 2.4 V |
| S12 | 2.1 V | 1.2 V | 1.6 V | 1.6 V | 2.4 V |
| S13 | 2.2 V | 1.3 V | 1.9 V | 1.8 V | 2.4 V |
| S14 | 2.3 V | 1.4 V | 2.2 V | 1.8 V | 2.4 V |
| S15 | 2.4 V | 1.5 V | 2.5 V | 1.8 V | 2.4 V |

In Embodiment 1, the common source line voltage in the pre-charge stage is increased between one programming shot and a subsequent programming shot, and each values of the common source line voltage increased between the one programming shot and the subsequent programming shot are the same. In detail, the common source line voltage applied in the pre-charge stage of the first programming shot (S1) is 1V, the common source line voltage applied in the pre-charge stage of the second programming shot (S2) is 1.1V, the common source line voltage applied in the pre-charge stage of the third programming shot (S3) is 1.2V, the common source line voltage applied in the pre-charge stage of the fourth programming shot (S4) is 1.3V, the common source line voltage applied in the pre-charge stage of the fifth programming shot (S5) is 1.4V, the common source line voltage applied in the pre-charge stage of the sixth programming shot (S6) is 1.5V, the common source line voltage applied in the pre-charge stage of the seventh programming shot (S7) is 1.6V, the common source line voltage applied in the pre-charge stage of the eighth programming shot (S8) is 1.7V, the common source line voltage applied in the pre-charge stage of the ninth programming shot (S9) is 1.8V, the common source line voltage applied in the pre-charge stage of the tenth programming shot (S10) is 1.9V, the common source line voltage applied in the pre-charge stage of the eleventh programming shot (S11) is 2.0V, the common source line voltage applied in the pre-charge stage of the twelfth programming shot (S12) is 2.1V, the common source line voltage applied in the pre-charge stage of the thirteenth programming shot (S13) is 2.2V, the common source line voltage applied in the pre-charge stage of the fourteenth programming shot (S14) is 2.3V, the common source line voltage applied in the pre-charge stage of the fifteenth programming shot (S15) is 2.4V. In addition, each values of the common source line voltage increased between one programming shot and a subsequent programming shot are all 0.1 V.

In Embodiment 2, the plurality of programming shots comprise a first period and a second period. The common source line voltage in the pre-charge stage is unchanged between one programming shot and a subsequent programming shot of the first period. The common source line voltage in the pre-charge stage is increased between one programming shot and a subsequent programming shot of the second period. In detail, the first period of the programming shots is from the first programming shot to the tenth programming shot (S1 to S10), in which the common source line voltage in the pre-charge stage keeps 1.0 V of an unchanged pre-charge voltage. The second period of the programming shots is from the tenth programming shot to the fifteenth programming shot (S10 to S15), in which the common source line voltage in the pre-charge stage is increased between one programming shot and a subsequent programming shot, and each values of the common source line voltage increased between the one programming shot and the subsequent programming shot are all 0.1 V.

In Embodiment 3, the plurality of programming shots also comprise a first period and a second period. The common source line voltage in the pre-charge stage is unchanged between one programming shot and a subsequent programming shot of the first period. The common source line voltage in the pre-charge stage is increased between one programming shot and a subsequent programming shot of the second period. In detail, the first period of the programming shots is from the first programming shot to the tenth programming shot (S1 to S10), in which the common source line voltage in the pre-charge stage keeps 1.0 V of an unchanged pre-charge voltage. The second period of the programming shots is from the tenth programming shot to the fifteenth programming shot (S10 to S15), in which the common source line voltage in the pre-charge stage is increased between one programming shot and a subsequent programming shot, and each values of the common source line voltage increased between the one programming shot and the subsequent programming shot are all 0.3 V.

In Embodiment 4, the plurality of programming shots comprise a plurality of first periods and a plurality of second periods, and one of the plurality of second periods is arranged between neighbor two of the plurality of first periods. In detail, the programming shots comprises 5 first periods, which are respectively from the first programming shot to the third programming shot (S1 to S3), from the fourth programming shot to the sixth programming shot (S4 to S6), from the seventh programming shot to the ninth programming shot (S7 to S9), from the tenth programming shot to the twelfth programming shot (S10 to S12), and from the thirteenth programming shot to the fifteenth programming shot (S13 to S15), in which the common source line voltage in the pre-charge stage respectively keeps 1.0 V. 1.2 V. 1.4 V. 1.6 V and 1.8 V of an unchanged pre-charge voltage. Furthermore, the programming shots comprises 4 second periods, which are respectively from the third programming shot to the fourth programming shot (S3 to S4), from the sixth programming shot to the seventh programming shot (S6 to S7), from the ninth programming shot to the tenth programming shot (S9 to S10), and from the twelfth programming shot to the thirteenth programming shot (S12 to S13), in which the common source line voltage in the pre-charge stage is increased between one programming shot and a subsequent programming shot, and each values of the common source line voltage increased between the one programming shot and the subsequent programming shot are all 0.2 V.

In Embodiment 5, the plurality of programming shots comprise two first periods and one second period, and the one second period is arranged between the two first period. In detail, the two first period of the programming shots are respectively from the first programming shot to the tenth programming shot (S1 to S10) and from the eleventh programming shot to the fifteenth programming shot (S11 to S15), in which the common source line voltage in the pre-charge stage respectively keeps 1.0 V and 2.4 V of an unchanged pre-charge voltage. Furthermore, the second period of the programming shots is from the tenth programming shot to the eleventh programming shot (S10 to S11), in which the common source line voltage in the pre-charge stage is increased between the tenth programming shot and the eleventh programming shot, and value of the common source line voltage increased between the tenth programming shot and the eleventh programming shot is 1.4 V.

In this embodiment, by applying the common source line voltage VCSL_pre using ISPP in each of the pre-charge stages Tpre of the plurality of programming shots, the common source line voltage VCSL_pre with a relatively high voltage level could be applied to the common source line CSL in the final period of the plurality of programming shots (for example, the last five shots S11 to S15). Accordingly, it is possible to ensure that the channel potential of an unselected memory cell is at a sufficiently large voltage level to prevent generation of the FN tunneling effect in the unselected memory cell and reduce the likelihood of programming disturbance in the memory 10.

In addition, with reference to FIG. 2A, a ground voltage VSS is applied to a selected word line (which is the word line $WL_{24}$ in this embodiment) of each memory string in the pre-charge stage Tpre. In some embodiments, the ground voltage VSS has the same voltage level in each pre-charge stage Tpre (for example, Tpre1, Tpre2 and Tpre3 in FIG. 2A) of the plurality of programming shots. In the present embodiment, the ground voltage VSS is 0 V.

With reference to FIG. 2A and FIG. 3 together, in step S20, a programming voltage Vpgm is applied to a selected word line of each memory string in a programming stage Tpgm, and the programming voltage Vpgm is applied by using ISPP in the programming stages Tpgm of the plurality of programming shots. For example, as shown in FIG. 2A, a programming voltage Vpgm1 is applied to the selected word line (which is the word line $WL_{24}$ in this embodiment) of each memory string in a programming stage Tpgm1 of the first programming shot S1. A programming voltage Vpgm2 is applied to the selected word line of each memory string in a programming stage Tpgm2 of the second programming shot S2. A programming voltage Vpgm3 is applied to the selected word line of each memory string in a programming stage Tpgm3 of the third programming shot S3. The programming voltage Vpgm1 is less than or equal to the programming voltage Vpgm2, and the programming voltage Vpgm2 is less than or equal to the programming voltage Vpgm3 (Vpgm1≤Vpgm2≤Vpgm3).

The type of the programming voltage Vpgm applied in the programming stage Tpgm of the plurality of programming shots by using ISPP is not limited. For example, the programming voltage Vpgm in the programming stage could be increased between one programming shot and a subsequent programming shot, and each values of the programming voltage Vpgm between the one programming shot and the subsequent programming shot could be the same.

In this embodiment, by applying the programming voltage Vpgm in step S20 using ISPP in the corresponding programming stage Tpgm of the plurality of programming shots, the programming voltage Vpgm in the initial period of the plurality of programming shots (for example, the initial five shots S1 to S5) could have a relatively low voltage level, and the common source line voltage VCSL_pre with a relatively low voltage level could be applied to the common source line CSL in the initial period of the plurality of programming shots (for example, S1 to S5) in step S10, which prevents generation of a relatively large horizontal electric field on a specific word line (e.g., the word line $WL_{24}$) and induction of hot carrier disturbance.

In addition, with reference to FIG. 2A, the common source line voltage VCSL_pre applied to the common source line CSL could be raised to a power supply voltage VDD in the programming stage Tpgm. For example, the common source line voltage VCSL_pre1 applied to the common source line CSL could be raised to the power supply voltage VDD in the programming stage Tpgm1 of the first programming shot S1. In some embodiments, the power supply voltage VDD has the same voltage level in each programming stages Tpgm of the plurality of programming shots.

After that, a voltage waveform diagram of the bottom dummy word line DBWL, the ground select line GSL, the string select line SSL, and the bit line BL when performing a programming operation of an embodiment of the disclosure would be described below.

With reference to FIG. 2B, a pre-charge voltage VPASS_pre is applied to the bottom dummy word line DBWL in each pre-charge stage (including the pre-charge stage Tpre1, the pre-charge stage Tpre2, and the pre-charge stage Tpre3). In detail, the level of voltage in the bottom dummy word line DBWL could be increased from the ground voltage VSS to the pre-charge voltage VPASS_pre, and then decreased from the pre-charge voltage VPASS_pre to the ground voltage VSS in each pre-charge stage. Afterwards, the level of voltage in the bottom dummy word line DBWL could be increased from the ground voltage VSS to a pass voltage VDBWL, and then decreased from the pass voltage VDBWL to the ground voltage VSS in each programming stage (including the programming stage Tpgm1, the programming stage Tpgm2, and the programming stage Tpgm3).

With reference to FIG. 2B, a pre-charge voltage VPASS_pre is applied to the ground select line GSL in each pre-charge stage (including the pre-charge stage Tpre1, the pre-charge stage Tpre2, and the pre-charge stage Tpre3). In detail, the level of voltage in the ground select line GSL could be increased from the ground voltage VSS to the pre-charge voltage VPASS_pre, and then decreased from the pre-charge voltage VPASS_pre to the ground voltage VSS in each pre-charge stage. Afterwards, the level of voltage in the ground select line GSL keeps the ground voltage VSS in each programming stage (including the programming stage Tpgm1, the programming stage Tpgm2, and the programming stage Tpgm3).

With reference to FIG. 2B, a ground voltage VSS is applied to the string select line SSL in each pre-charge stage (including the pre-charge stage Tpre1, the pre-charge stage Tpre2, and the pre-charge stage Tpre3). Afterwards, a string select line voltage VSSL is applied to the string select line SSL in each programming stage (including the programming stage Tpgm1, the programming stage Tpgm2, and the programming stage Tpgm3). In detail, the level of voltage in the string select line SSL could be increased from the ground voltage VSS to the string select line voltage VSSL, and then decreased from the string select line voltage VSSL to the ground voltage VSS in each programming stage. In the present embodiment, the string select line voltage VSSL is 3.6 V, but the disclosure is not limited thereto.

With reference to FIG. 2B, a ground voltage VSS is applied to the program bit line (which is the bit line $BL_0$ in this embodiment) in each pre-charge stage (including the pre-charge stage Tpre1, the pre-charge stage Tpre2, and the pre-charge stage Tpre3). Afterwards, a bit line voltage VBL_pgm used to program the selected memory cell is applied to the program bit line in each programming stage (including the programming stage Tpgm1, the programming stage Tpgm2, and the programming stage Tpgm3). In the present embodiment, the bit line voltage VBL_pgm used to program the selected memory cell is 0 V, but the disclosure is not limited thereto.

With reference to FIG. 2B, a bit line voltage VBL_inhibit used to inhibit the unselected memory cell being programmed is applied to the inhibit bit line (which is the bit line $BL_1$ in this embodiment) in each pre-charge stage (including the pre-charge stage Tpre1, the pre-charge stage Tpre2, and the pre-charge stage Tpre3). In detail, the level of voltage in the inhibit bit line could be increased from the ground voltage VSS to the bit line voltage VBL_inhibit, and keeps the bit line voltage VBL_inhibit. Afterwards, the level of voltage in the inhibit bit line decreased from the bit line voltage VBL_inhibit to the ground voltage VSS in each programming stage (including the programming stage Tpgm1, the programming stage Tpgm2, and the programming stage Tpgm3). In the present embodiment, the bit line voltage VBL_inhibit used to inhibit the unselected memory cell being programmed is the power supply voltage VDD, but the disclosure is not limited thereto.

With reference to FIG. 2B, a ground voltage VSS is applied to the quick pass write (QPW) bit line (which is the bit line $BL_2$ in this embodiment) in each pre-charge stage (including the pre-charge stage Tpre1, the pre-charge stage Tpre2, and the pre-charge stage Tpre3). Afterwards, a bit line voltage VBL_QPW used to perform a quick pass write on the memory cell is applied to the QPW bit line (which is the bit line $BL_2$ in this embodiment) in each programming stage (including the programming stage Tpgm1, the programming stage Tpgm2, and the programming stage Tpgm3). In detail, the level of voltage in the QPW bit line could be increased from the ground voltage VSS to the bit line voltage VBL_QPW, and then decreased from the bit line voltage VBL_QPW to the ground voltage VSS in each programming stage.

Figure 4A:
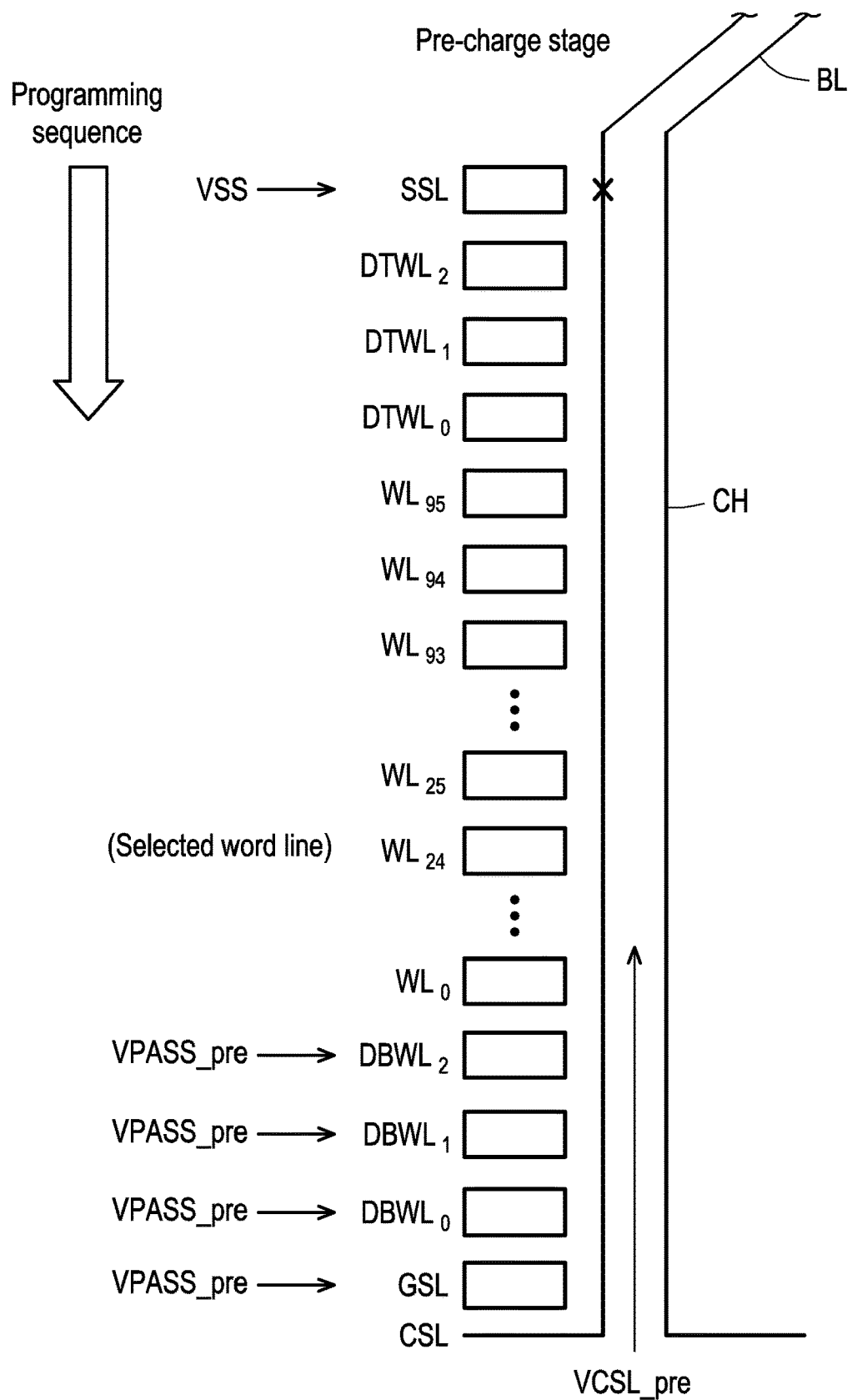
FIG. 4A shows a schematic diagram of applying voltages to a ground select line, a plurality of bottom dummy word lines, a common source line, and a string select line in a pre-charge stage of one programming shot of an embodiment of the disclosure.

FIG. 4A shows a schematic diagram of applying voltages to a ground select line GSL, a plurality of bottom dummy word lines $DBWL_0$-$DBWL_2$, a common source line CSL, and a string select line SSL in a pre-charge stage of one programming shot of an embodiment of the disclosure.

With reference to FIG. 4A, regarding the ground select line GSL and the plurality of bottom dummy word lines $DBWL_0$-$DBWL_2$, a pre-charge voltage VPASS_pre is applied to the ground select line GSL and the plurality of bottom dummy word lines $DBWL_0$-$DBWL_2$ in the pre-charge stage, so a ground select gate (not shown) coupled to the ground select line GSL and a dummy gate (not shown) coupled to the corresponding bottom dummy word lines $DBWL_0$-$DBWL_2$ could be opened. Regarding the common source line CSL, a common source line voltage VCSL_pre is applied to the common source line CSL in the pre-charge stage by using incremental-step-pulse programming. Since the ground select gate is open, the level of voltage in the channel layer CH is raised through the applied common source line voltage VCSL_pre. Regarding the string select line SSL, a ground voltage VSS is applied to the string select line SSL of each memory string in the pre-charge stage, so a string select gate (not shown) coupled to the string select line SSL could be closed and in an off state.

Figure 4B:
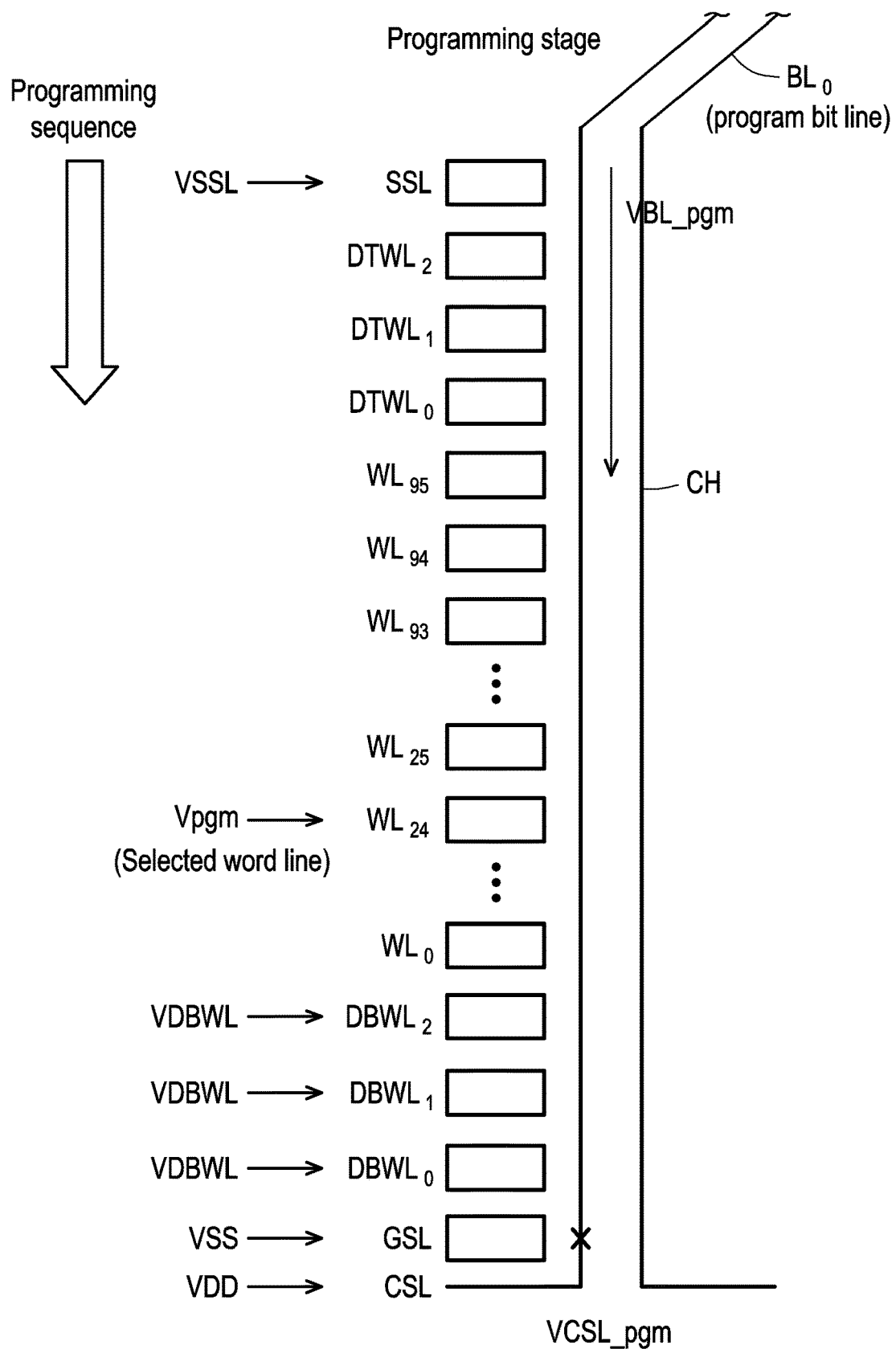
FIGS. 4B-4D show schematic diagrams of applying voltages to the ground select line, the string select line, the common source line, the selected word line, the unselected word lines, and the bit line in a programming stage of one programming shot of an embodiment of the disclosure, wherein the bit line in FIG. 4B is a program bit line, the bit line in FIG. 4C is an inhibit bit line, and the bit line in FIG. 4D is a quick pass write (QPW) bit line.
Figure 4C:
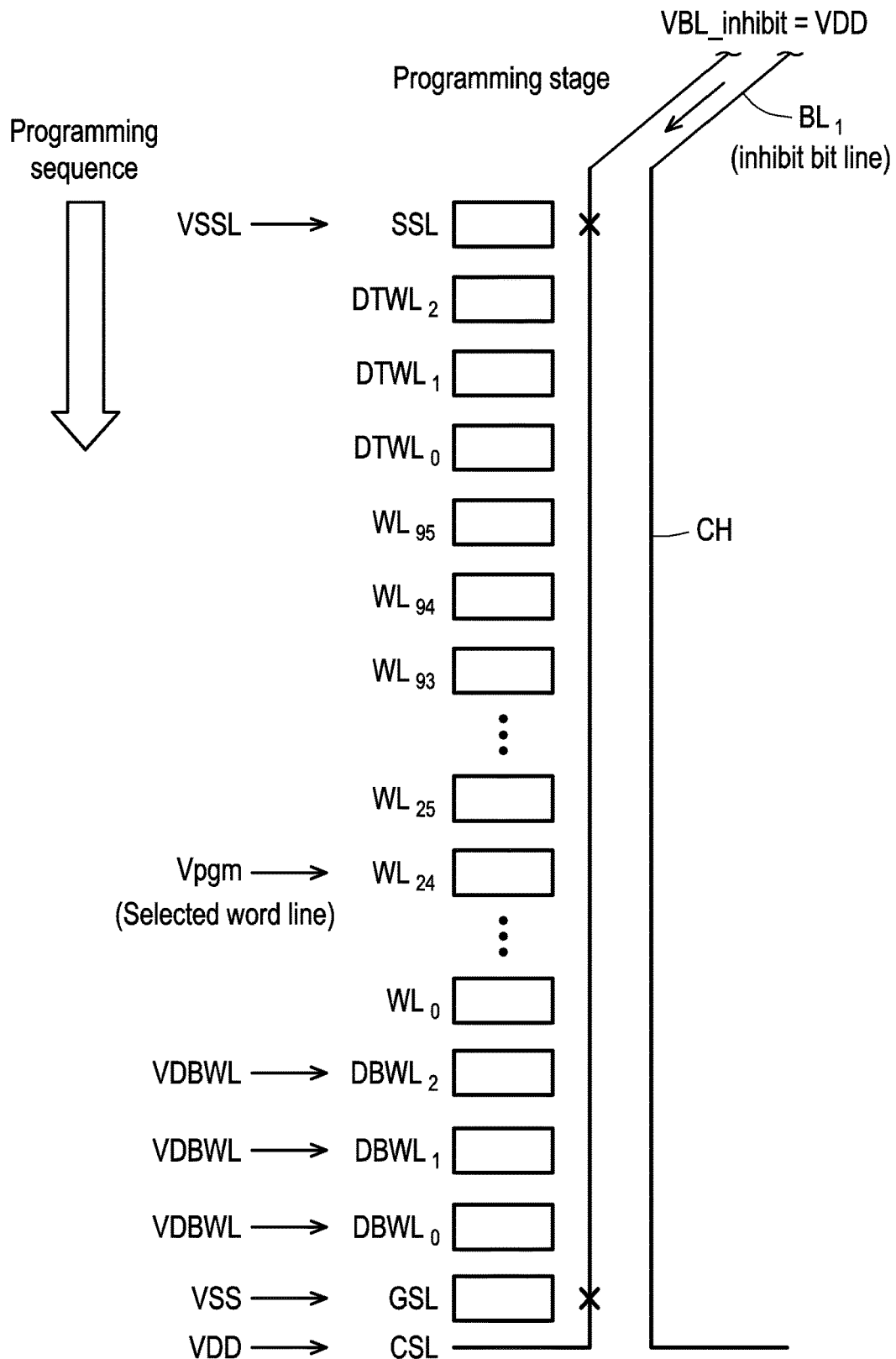
Figure 4D:
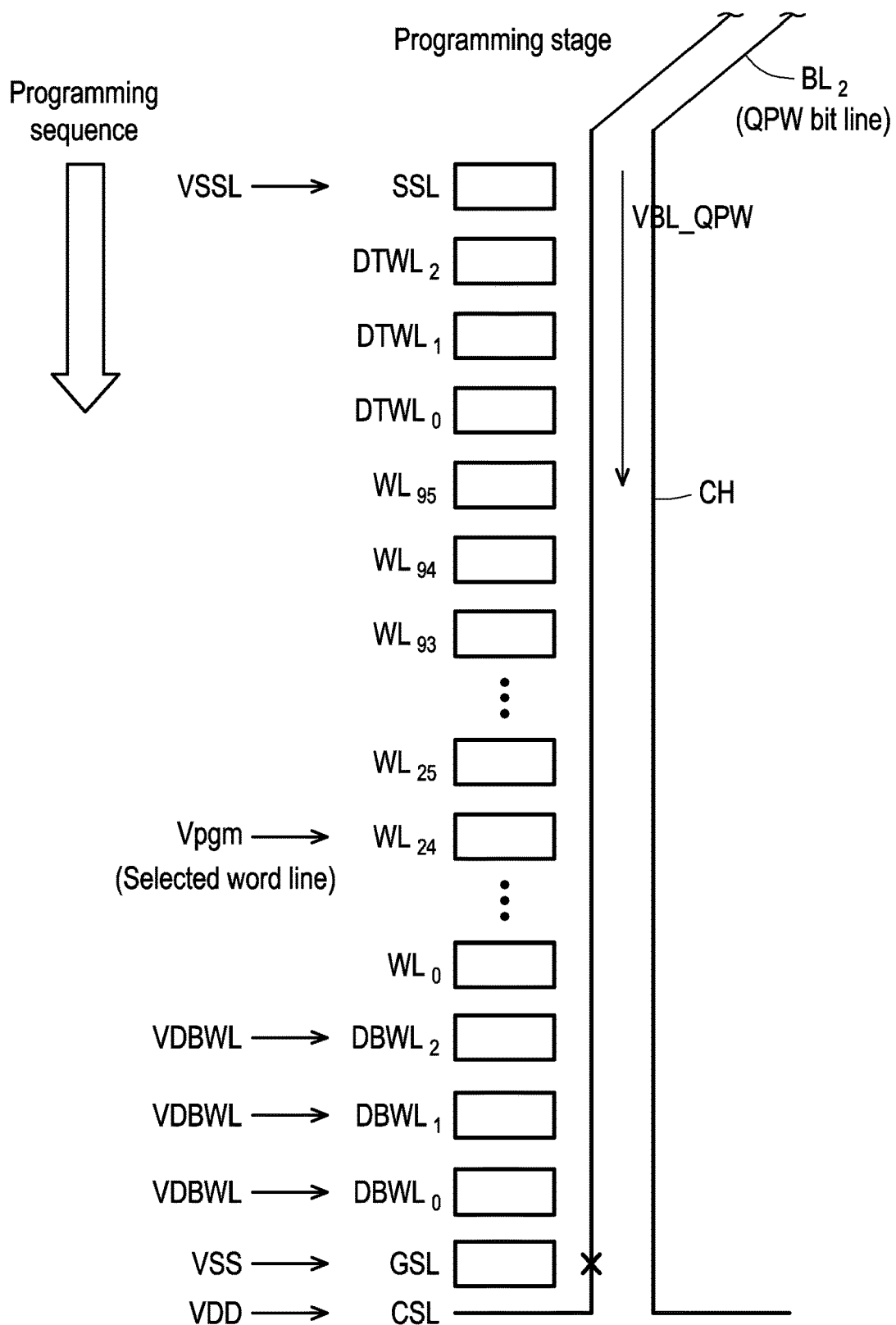

FIGS. 4B-4D show schematic diagrams of applying voltages to the ground select line GSL, the string select line SSL, the common source line CSL, the selected word line, the unselected word lines, and the bit lines $BL_0$-$BL_2$ in a programming stage of one programming shot of an embodiment of the disclosure, wherein the bit line $BL_0$ in FIG. 4B is a program bit line, the bit line $BL_1$ in FIG. 4C is an inhibit bit line, and the bit line $BL_2$ in FIG. 4D is a QPW bit line.

With reference to FIG. 4B, regarding the ground select line GSL, a ground voltage VSS is applied to the ground select line GSL in the programming stage, so the ground select gate coupled to the ground select line GSL could be closed and in an off state. Regarding the string select line SSL, a string select line voltage VSSL is applied to the string select line SSL in the programming stage, so the string select gate coupled to the string select line SSL could be opened. Regarding the common source line CSL, a power supply voltage VDD is applied to the common source line CSL in the programming stage. Regarding the selected word line (which is the word line $WL_{24}$ in this embodiment) and the unselected word lines (including the plurality of bottom dummy word lines $DBWL_0$-$DBWL_2$), a programming voltage Vpgm is applied to the selected word line in the programming stage by using incremental-step-pulse programming, and a pass voltage VDBWL is applied to the unselected word line in the programming stage. Regarding the program bit line (which is the bit line $BL_0$ in this embodiment), a bit line voltage VBL_pgm is applied to the program bit line in the programming stage to perform a programming operation. In detail, when the programming voltage Vpgm is applied to the selected word line, a relatively high voltage difference between the programming voltage Vpgm and the bit line voltage VBL_pgm may cause tunneling of electrons from the channel layer CH to the charge trap layer CTL (shown in FIG. 1B) to be captured thereby.

With reference to FIG. 4C, regarding the ground select line GSL, the ground voltage VSS is applied to the ground select line GSL in the programming stage. Regarding the string select line SSL, the string select line voltage VSSL is applied to the string select line SSL in the programming stage. Regarding the common source line CSL, a power supply voltage VDD is applied to the common source line CSL in the programming stage. Regarding the selected word line (which is the word line $WL_{24}$ in this embodiment) and the unselected word lines (including the plurality of bottom dummy word lines $DBWL_0$-$DBWL_2$), the programming voltage Vpgm is applied to the selected word line in the programming stage by using incremental-step-pulse programming, and the pass voltage VDBWL is applied to the unselected word line in the programming stage. Regarding the inhibit bit line (which is the bit line $BL_1$ in this embodiment), the inhibit bit line ($BL_1$) keeps the bit line voltage VBL_inhibit in the programming stage, in which the bit line voltage VBL_inhibit could be the power supply voltage VDD to enhance the level of voltage of the channel layer CH, so as to perform a programming inhibit operation.

With reference to FIG. 4D, regarding the ground select line GSL, the ground voltage VSS is applied to the ground select line GSL in the programming stage. Regarding the string select line SSL, the string select line voltage VSSL is applied to the string select line SSL in the programming stage. Regarding the common source line CSL, the power supply voltage VDD is applied to the common source line CSL in the programming stage. Regarding the selected word line (which is the word line $WL_{24}$ in this embodiment) and the unselected word lines (including the plurality of bottom dummy word lines $DBWL_0$-$DBWL_2$), the programming voltage Vpgm is applied to the selected word line in the programming stage by using incremental-step-pulse programming, and the pass voltage VDBWL is applied to the unselected word line in the programming stage. Regarding the QPW bit line (which is the bit line $BL_2$ in this embodiment), a bit line voltage VBL_QPW is applied to the QPW bit line in the programming stage to perform a quick pass write operation.

It is worth noting that, although a three-dimensional memory is taken as an example of the memory 10 of this embodiment, the method of programming a memory of the embodiment of the disclosure may be applied to a two-dimensional memory (e.g., a two-dimensional NAND flash memory). In addition, the method of programming a memory of the embodiment of the disclosure may be applied to a memory cell including a single-level cell (SLC), a multi-level cell (MLC), a triple-level cell (TLC), or a quad-level cell (QLC).

Figure 5A:
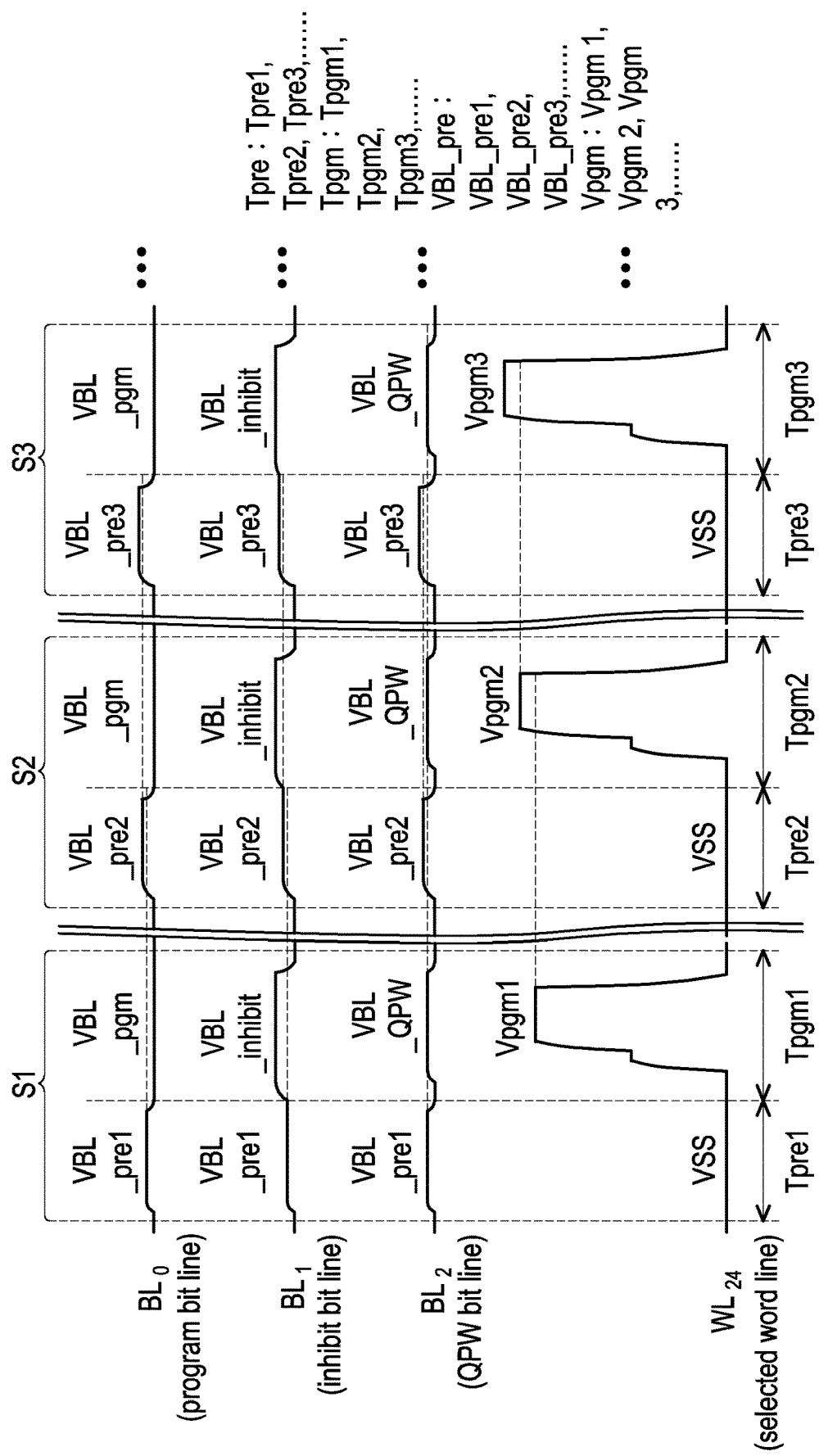
FIGS. 5A and 5B show a voltage waveform diagram of a memory performing a programming operation of another embodiment of the disclosure.
Figure 5B:
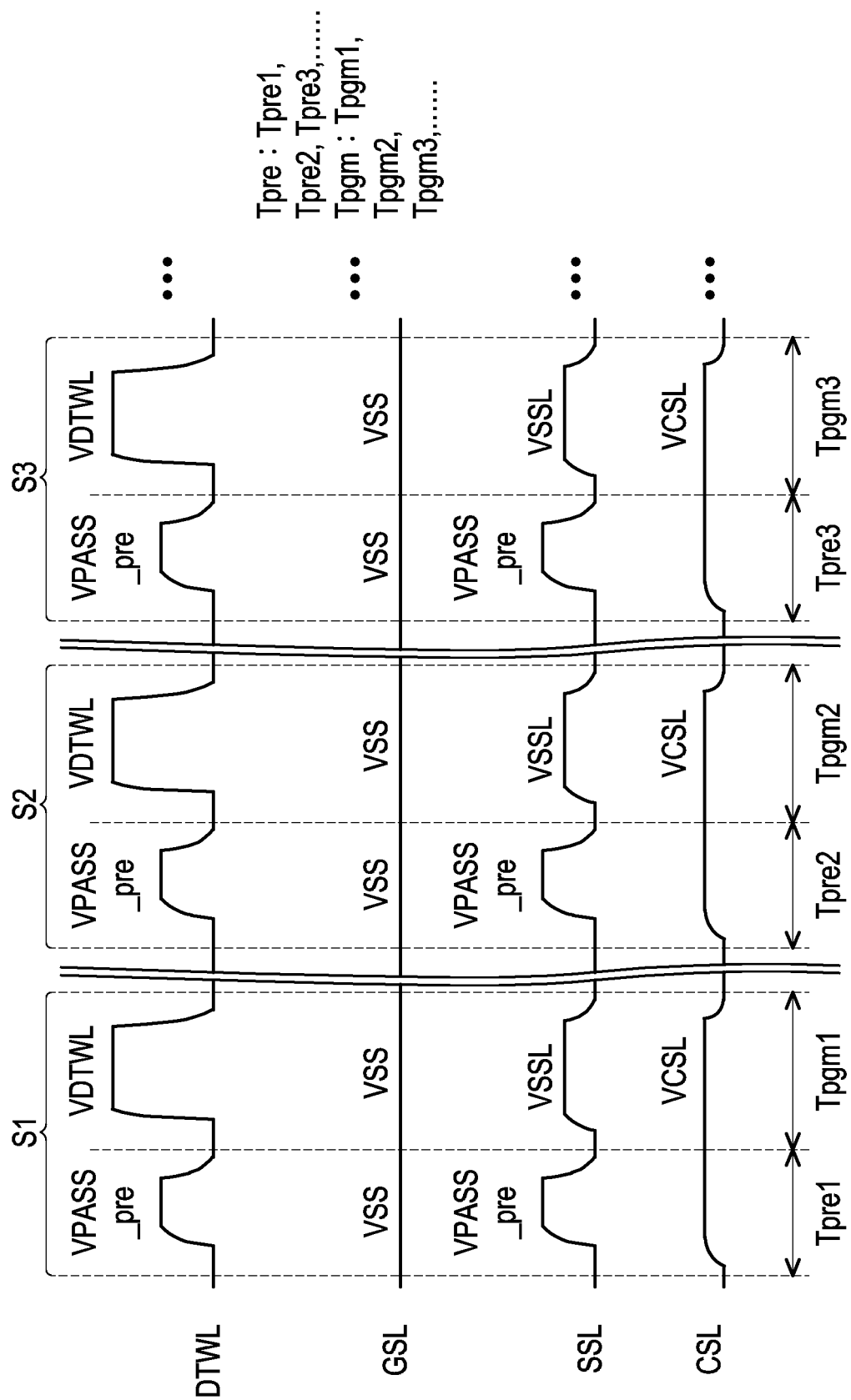
Figure 6:
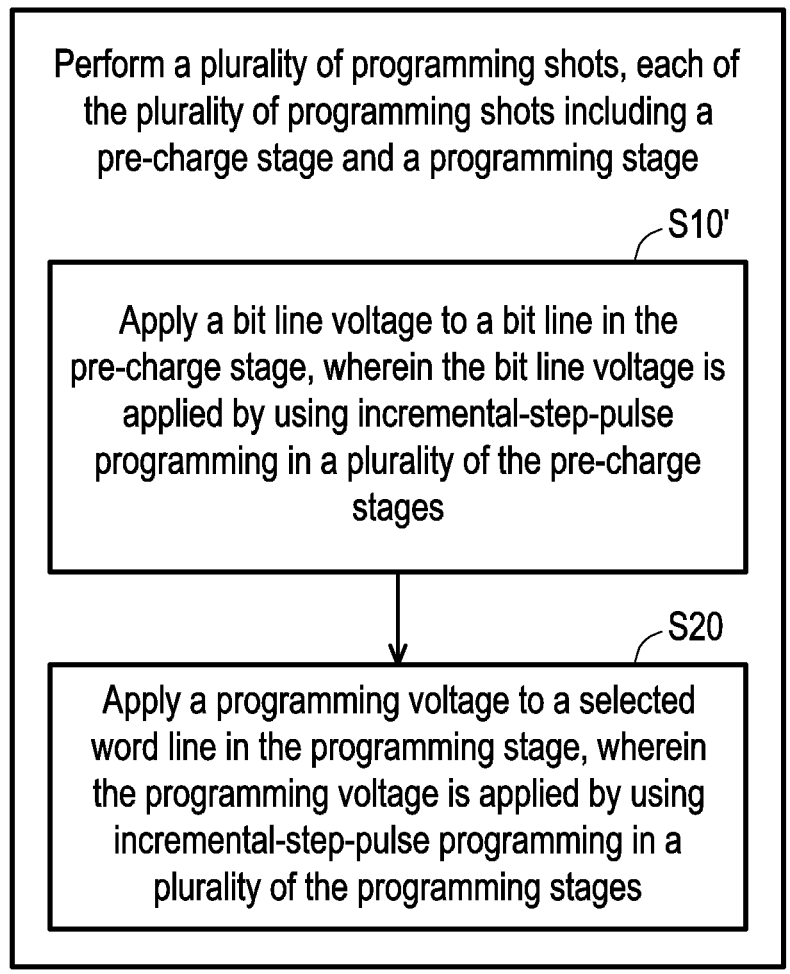
FIG. 6 shows a flowchart of a method of programming a memory of another embodiment of the disclosure.

FIGS. 5A and 5B show a voltage waveform diagram of a memory performing a programming operation of another embodiment of the disclosure, and FIG. 6 shows a flowchart of a method of programming a memory of another embodiment of the disclosure. The memory 10 is taken as an example of the memory illustrated in FIG. 6, but it should be noted that the disclosure is not limited thereto.

With reference to FIG. 5A and FIG. 6 together, to be described firstly, in this embodiment, a programming operation including a plurality of programming shots is performed on the memory 10, and a programming operation including 15 programming shots performed on the memory 10 is taken as an example, but the disclosure is not limited thereto. In addition, although not shown in FIG. 6, a programming verification may be performed between two programming shots.

It is worth noting that, in this embodiment, although the programming operation is performed taking a sequence from the bottom of the memory 10 to the top of the memory 10 (the word line $WL_0$ to the word line $WL_{95}$) as an example, the disclosure is not limited thereto.

In step S10', a bit line voltage VBL_pre is applied to the bit line BL in a pre-charge stage Tpre, and the bit line voltage VBL_pre is applied by using incremental-step-pulse programming (ISPP) in the pre-charge stages Tpre of the plurality of programming shots. In this embodiment, the bit line BL includes the program bit line ($BL_0$), the inhibit bit line ($BL_1$), and the QPW bit line ($BL_2$). For example, as shown in FIG. 5A, a bit line voltage VBL_pre1 is applied to the program bit line ($BL_0$), the inhibit bit line ($BL_1$), and the QPW bit line ($BL_2$) in a pre-charge stage Tpre1 of a first programming shot S1, a bit line voltage VBL_pre2 is applied to the program bit line ($BL_0$), the inhibit bit line ($BL_1$), and the QPW bit line ($BL_2$) in a pre-charge stage Tpre2 of a second programming shot S2, and a bit line voltage VBL_pre3 is applied to the program bit line ($BL_0$), the inhibit bit line (BL$_1$), and the QPW bit line (BL$_2$) in a pre-charge stage Tpre3 of a third programming shot S3. The bit line voltage VBL_pre1 is less than or equal to the bit line voltage VBL_pre2, and the bit line voltage VBL_pre2 is less than or equal to the bit line voltage VBL_pre3 (VBL_pre1≤VBL_pre2≤VBL_pre3).

With reference to FIG. 5A, after applying the bit line voltage VBL_pre, the level of voltage in the program bit line (BL$_0$) could be decreased from the bit line voltage VBL_pre to the ground voltage VSS in each pre-charge stage Tpre, the level of voltage in the inhibit bit line (BL$_1$) could keep the bit line voltage VBL_pre in each pre-charge stage Tpre, and the level of voltage in the QPW bit line (BL$_2$) could be decreased from the bit line voltage VBL_pre to the ground voltage VSS in each pre-charge stage Tpre.

In this embodiment, the bit line voltage VBL_pre applied in the pre-charge stages Tpre f the 15 programming shots may be as shown in Table 2 below and would be described below, but the disclosure is not limited thereto.

TABLE 2

Forms of bit line voltages applied in pre-charge stages

| Programming shot | Embodiment 6 | Embodiment 7 | Embodiment 8 | Embodiment 9 | Embodiment 10 |
|---|---|---|---|---|---|
| S1 | 1 V | 1 V | 1 V | 1 V | 1 V |
| S2 | 1.1 V | 1 V | 1 V | 1 V | 1 V |
| S3 | 1.2 V | 1 V | 1 V | 1 V | 1 V |
| S4 | 1.3 V | 1 V | 1 V | 1.2 V | 1 V |
| S5 | 1.4 V | 1 V | 1 V | 1.2 V | 1 V |
| S6 | 1.5 V | 1 V | 1 V | 1.2 V | 1 V |
| S7 | 1.6 V | 1 V | 1 V | 1.4 V | 1 V |
| S8 | 1.7 V | 1 V | 1 V | 1.4 V | 1 V |
| S9 | 1.8 V | 1 V | 1 V | 1.4 V | 1 V |
| S10 | 1.9 V | 1 V | 1 V | 1.6 V | 1 V |
| S11 | 2.0 V | 1.1 V | 1.3 V | 1.6 V | 2.4 V |
| S12 | 2.1 V | 1.2 V | 1.6 V | 1.6 V | 2.4 V |
| S13 | 2.2 V | 1.3 V | 1.9 V | 1.8 V | 2.4 V |
| S14 | 2.3 V | 1.4 V | 2.2 V | 1.8 V | 2.4 V |
| S15 | 2.4 V | 1.5 V | 2.5 V | 1.8 V | 2.4 V |

In Embodiment 6, the bit line voltage in the pre-charge stage is increased between one programming shot and a subsequent programming shot, and each values of the common source line voltage increased between the one programming shot and the subsequent programming shot are the same. In detail, the bit line voltage applied in the pre-charge stage of the first programming shot (S1) is 1V, the bit line voltage applied in the pre-charge stage of the second programming shot (S2) is 1.1V, the bit line voltage applied in the pre-charge stage of the third programming shot (S3) is 1.2V, the bit line voltage applied in the pre-charge stage of the fourth programming shot (S4) is 1.3V, the bit line voltage applied in the pre-charge stage of the fifth programming shot (S5) is 1.4V, the bit line voltage applied in the pre-charge stage of the sixth programming shot (S6) is 1.5V, the bit line voltage applied in the pre-charge stage of the seventh programming shot (S7) is 1.6V, the bit line voltage applied in the pre-charge stage of the eighth programming shot (S8) is 1.7V, the bit line voltage applied in the pre-charge stage of the ninth programming shot (S9) is 1.8V, the bit line voltage applied in the pre-charge stage of the tenth programming shot (S10) is 1.9V, the bit line voltage applied in the pre-charge stage of the eleventh programming shot (S11) is 2.0V, the bit line voltage applied in the pre-charge stage of the twelfth programming shot (S12) is 2.1V, the bit line voltage applied in the pre-charge stage of the thirteenth programming shot (S13) is 2.2V, the bit line voltage applied in the pre-charge stage of the fourteenth programming shot (S14) is 2.3V, the bit line voltage applied in the pre-charge stage of the fifteenth programming shot (S15) is 2.4V. In addition, each values of the bit line voltage increased between one programming shot and a subsequent programming shot are all 0.1 V.

In Embodiment 7, the plurality of programming shots comprise a first period and a second period, the bit line voltage in the pre-charge stage is unchanged between one programming shot and a subsequent programming shot of the first period, and the bit line voltage in the pre-charge stage is increased between one programming shot and a subsequent programming shot of the second period. In detail, the first period of the programming shots is from the first programming shot to the tenth programming shot (S1 to S10), in which the bit line voltage in the pre-charge stage keeps 1.0 V of an unchanged pre-charge voltage; and the second period of the programming shots is from the tenth programming shot to the fifteenth programming shot (S10 to S15), in which the bit line voltage in the pre-charge stage is increased between one programming shot and a subsequent programming shot, and each values of the bit line voltage increased between the one programming shot and the subsequent programming shot are all 0.1 V.

In Embodiment 8, the plurality of programming shots also comprise a first period and a second period, the bit line voltage in the pre-charge stage is unchanged between one programming shot and a subsequent programming shot of the first period, and the bit line voltage in the pre-charge stage is increased between one programming shot and a subsequent programming shot of the second period. In detail, the first period of the programming shots is from the first programming shot to the tenth programming shot (S1 to S10), in which the bit line voltage in the pre-charge stage keeps 1.0 V of an unchanged pre-charge voltage; and the second period of the programming shots is from the tenth programming shot to the fifteenth programming shot (S10 to S15), in which the bit line voltage in the pre-charge stage is increased between one programming shot and a subsequent programming shot, and each values of the bit line voltage between the one programming shot and the subsequent programming shot are all 0.3 V.

In Embodiment 9, the plurality of programming shots comprise a plurality of first periods and a plurality of second periods, and one of the plurality of second periods is arranged between neighbor two of the plurality of first periods. In detail, the programming shots comprises 5 first periods, which are respectively from the first programming shot to the third programming shot (S1 to S3), from the fourth programming shot to the sixth programming shot (S4 to S6), from the seventh programming shot to the ninth programming shot (S7 to S9), from the tenth programming shot to the twelfth programming shot (S10 to S12), and from the thirteenth programming shot to the fifteenth programming shot (S13 to S15), in which the bit line voltage in the pre-charge stage respectively keeps 1.0 V. 1.2 V. 1.4 V. 1.6 V and 1.8 V of an unchanged pre-charge voltage. Furthermore, the programming shots comprises 4 second periods, which are respectively from the third programming shot to the fourth programming shot (S3 to S4), from the sixth programming shot to the seventh programming shot (S6 to S7), from the ninth programming shot to the tenth programming shot (S9 to S10), and from the twelfth programming shot to the thirteenth programming shot (S12 to S13), in which the c bit line voltage in the pre-charge stage is increased between one programming shot and a subsequent programming shot, and each values of the bit line voltage increased between the one programming shot and the subsequent programming shot are all 0.2 V.

In Embodiment 10, the plurality of programming shots comprise two first periods and one second period, and the one second period is arranged between the two first period. In detail, the two first period of the programming shots are respectively from the first programming shot to the tenth programming shot (S1 to S10) and from the eleventh programming shot to the fifteenth programming shot (S11 to S15), in which the bit line voltage in the pre-charge stage respectively keeps 1.0 V and 2.4 V of an unchanged pre-charge voltage. Furthermore, the second period of the programming shots is from the tenth programming shot to the eleventh programming shot (S10 to S11), in which the bit line voltage in the pre-charge stage is increased between the tenth programming shot and the eleventh programming shot, and value of the bit line voltage between the tenth programming shot and the eleventh programming shot is 1.4 V.

In this embodiment, by applying the bit line voltage VBL_pre using ISPP in each of the pre-charge stages Tpre of the plurality of programming shots, the bit line voltage VBL_pre with a relatively high voltage level could be applied to the bit line BL in the final period of the plurality of programming shots (for example, the last five shots S11 to S15) in step S10'. Accordingly, it is possible to ensure that the channel potential of an unselected memory cell is at a sufficiently large voltage level to prevent generation of the FN tunneling effect in the unselected memory cell and reduce the likelihood of programming disturbance in the memory 10.

In addition, with reference to FIG. 5A, a ground voltage VSS is applied to a selected word line (which is the word line $WL_{24}$ in this embodiment) of each memory string in the pre-charge stage Tpre. In some embodiments, the ground voltage VSS has the same voltage level in each pre-charge stage Tpre of the plurality of programming shots. In the present embodiment, the ground voltage VSS is 0 V.

With reference to FIG. 5A and FIG. 6 together, in step S20, a programming voltage is applied to a selected word line of each memory string in a programming stage, and the programming voltage is applied by using ISPP in the programming stages of the plurality of programming shots, which have been described in above embodiments in detail and would be omitted in this embodiment.

In this embodiment, by applying the programming voltage Vpgm in step S20 using ISPP in the corresponding programming stage Tpgm of the plurality of programming shots, the programming voltage Vpgm in the initial period of the plurality of programming shots (for example, S1 to S5) could have a relatively low voltage level, and the bit line voltage VBL_pre with a relatively low voltage level is applied to the bit line BL in the initial period of the plurality of programming shots (for example, the initial five shots S1 to S5) in step S10', which prevents generation of a relatively large horizontal electric field on a specific word line (e.g., the word line $WL_{24}$) and induction of hot carrier disturbance.

In addition, with reference to FIG. 5A, the bit line voltage VBL_pgm used to program the selected memory cell is applied to the program bit line ($BL_0$) in each programming stage Tpgm. In the present embodiment, the bit line voltage VBL_pgm used to program the selected memory cell is 0 V, but the disclosure is not limited thereto. The level of voltage in the inhibit bit line ($BL_1$) could be increased from the bit line voltage VBL_pre to the power supply voltage VDD in each programming stage Tpgm, and then decreased from the power supply voltage VDD to the ground voltage VSS. The level of voltage in the QPW bit line ($BL_2$) could be increased from the ground voltage VSS to the bit line voltage VBL_QPW, and then decreased from the bit line voltage VBL_QPW to the ground voltage VSS in each programming stage Tpgm.

After that, a voltage waveform diagram of the top dummy word line DTWL, the ground select line GSL, the string select line SSL, and the common source line CSL when performing a programming operation of an embodiment of the disclosure would be described below.

With reference to FIG. 5B, a pre-charge voltage VPASS_pre is applied to the top dummy word line DTWL of each memory string in each pre-charge stage (including the pre-charge stage Tpre1, the pre-charge stage Tpre2, and the pre-charge stage Tpre3). In detail, the level of voltage in the top dummy word line DTWL could be increased from the ground voltage VSS to the pre-charge voltage VPASS_pre, and then decreased from the pre-charge voltage VPASS_pre to the ground voltage VSS in each pre-charge stage. Afterwards, the level of voltage in the top dummy word line DTWL could be increased from the ground voltage VSS to a pass voltage VDTWL, and then decreased from the pass voltage VDTWL to the ground voltage VSS in each programming stage (including the programming stage Tpgm1, the programming stage Tpgm2, and the programming stage Tpgm3).

With reference to FIG. 5B, a ground voltage VSS is applied to the ground select line GSL of each memory string in each pre-charge stage (including the pre-charge stage Tpre1, the pre-charge stage Tpre2, and the pre-charge stage Tpre3). Afterwards, the level of voltage in the ground select line GSL keeps the ground voltage VSS in each programming stage (including the programming stage Tpgm1, the programming stage Tpgm2, and the programming stage Tpgm3).

With reference to FIG. 5B, the pre-charge voltage VPASS_pre is applied to the string select line SSL in each pre-charge stage (including the pre-charge stage Tpre1, the pre-charge stage Tpre2, and the pre-charge stage Tpre3). In detail, the level of voltage in the string select line SSL could be increased from the ground voltage VSS to the pre-charge voltage VPASS_pre, and then decreased from the pre-charge voltage VPASS_pre to the ground voltage VSS in each pre-charge stage. Afterwards, a string select line voltage VSSL is applied to the string select line SSL of each memory string in each programming stage (including the programming stage Tpgm1, the programming stage Tpgm2, and the programming stage Tpgm3). In detail, the level of voltage in the string select line SSL could be increased from the ground voltage VSS to the string select line voltage VSSL, and then decreased from the string select line voltage VSSL to the ground voltage VSS in each programming stage. In the present embodiment, the string select line voltage VSSL is 3.6 V, but the disclosure is not limited thereto.

With reference to FIG. 5B, a common source voltage VCSL is applied to the common source line CSL in each pre-charge stage (including the pre-charge stage Tpre1, the pre-charge stage Tpre2, and the pre-charge stage Tpre3). In detail, the level of voltage in the common source line CSL could be increased from the ground voltage VSS to the common source voltage VCSL. In the present embodiment, the common source voltage VCSL could be the power supply voltage VDD, but the disclosure is not limited thereto. Afterwards, the level of voltage in the common source line CSL keeps the common source voltage VCSL in each programming stage (including the programming stage Tpgm1, the programming stage Tpgm2, and the programming stage Tpgm3), and then decreased from the common source voltage VCSL to the ground voltage VSS in each programming stage.

Figure 7A:
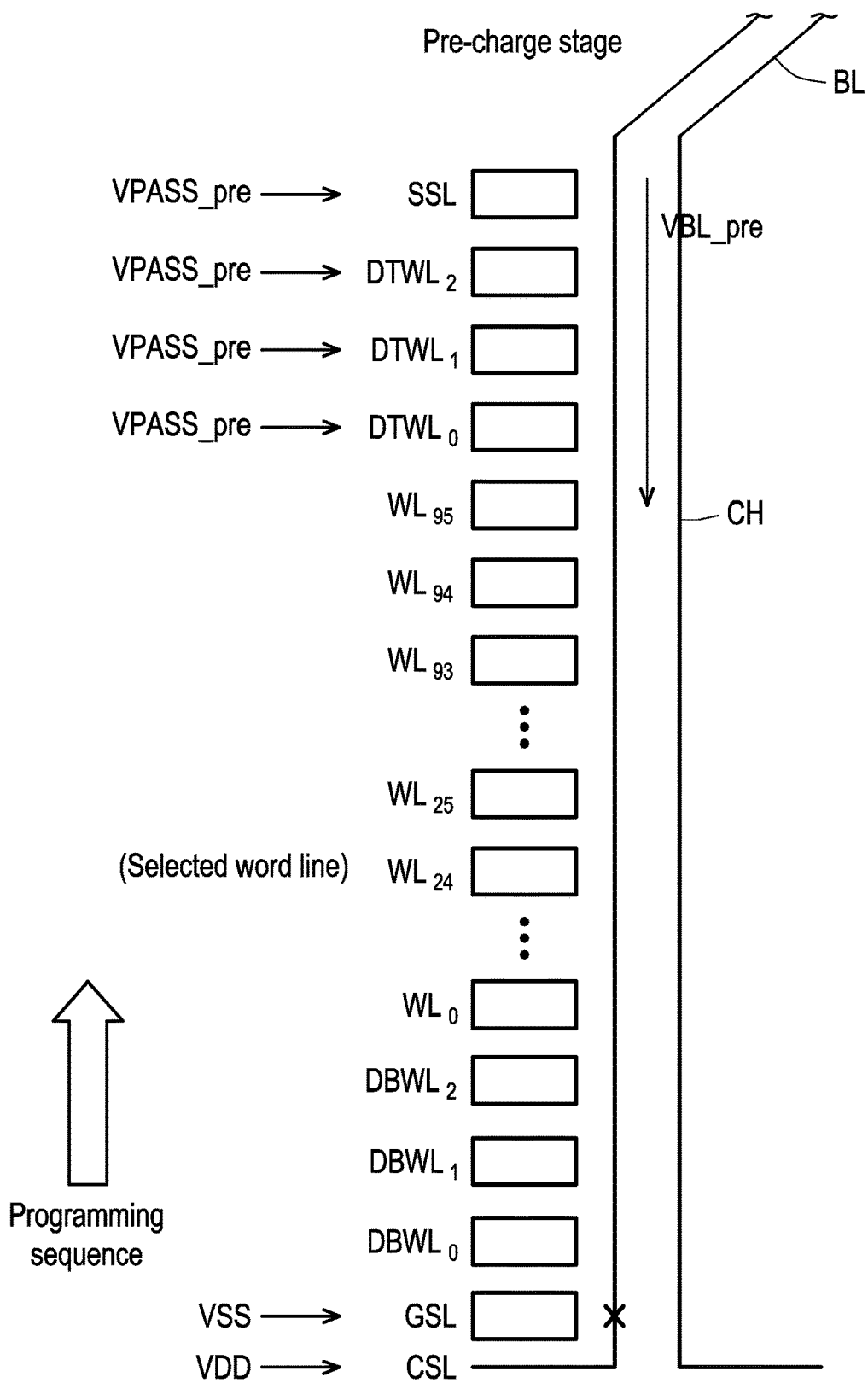
FIG. 7A shows a schematic diagram of applying voltages to a string select line, a plurality of top dummy word lines, a bit line, a ground select line, and a common source line in a pre-charge stage of one programming shot of another embodiment of the disclosure.

FIG. 7A shows a schematic diagram of applying voltages to a string select line SSL, a plurality of top dummy word lines $DTWL_0$-$DTWL_2$, a bit line BL, a ground select line GSL, and a common source line CSL in a pre-charge stage of one programming shot of another embodiment of the disclosure.

With reference to FIG. 7A, regarding the string select line SSL and the plurality of top dummy word lines $DTWL_0$-$DTWL_2$, a pre-charge voltage VPASS_pre is applied to the string select line SSL and the plurality of top dummy word lines $DTWL_0$-$DTWL_2$ in the pre-charge stage, so a string select gate (not shown) coupled to the string select line SSL and a dummy gate (not shown) coupled to the corresponding top dummy word lines $DTWL_0$-$DTWL_2$ could be opened. Regarding the bit line BL, a bit line voltage VBL_pre is applied to the bit line BL in the pre-charge stage by using incremental-step-pulse programming. Since the string select gate is open, the level of voltage in the channel layer CH is raised through the applied bit line voltage VBL_pre. Regarding the ground select line GSL, a ground voltage VSS is applied to the ground select line GSL in the pre-charge stage, so a ground select gate (not shown) coupled to the ground select line GSL could be closed and in an off state. Regarding the common source line CSL, a power supply voltage VDD could be applied to the common source line CSL in the pre-charge stage.

Figure 7B:
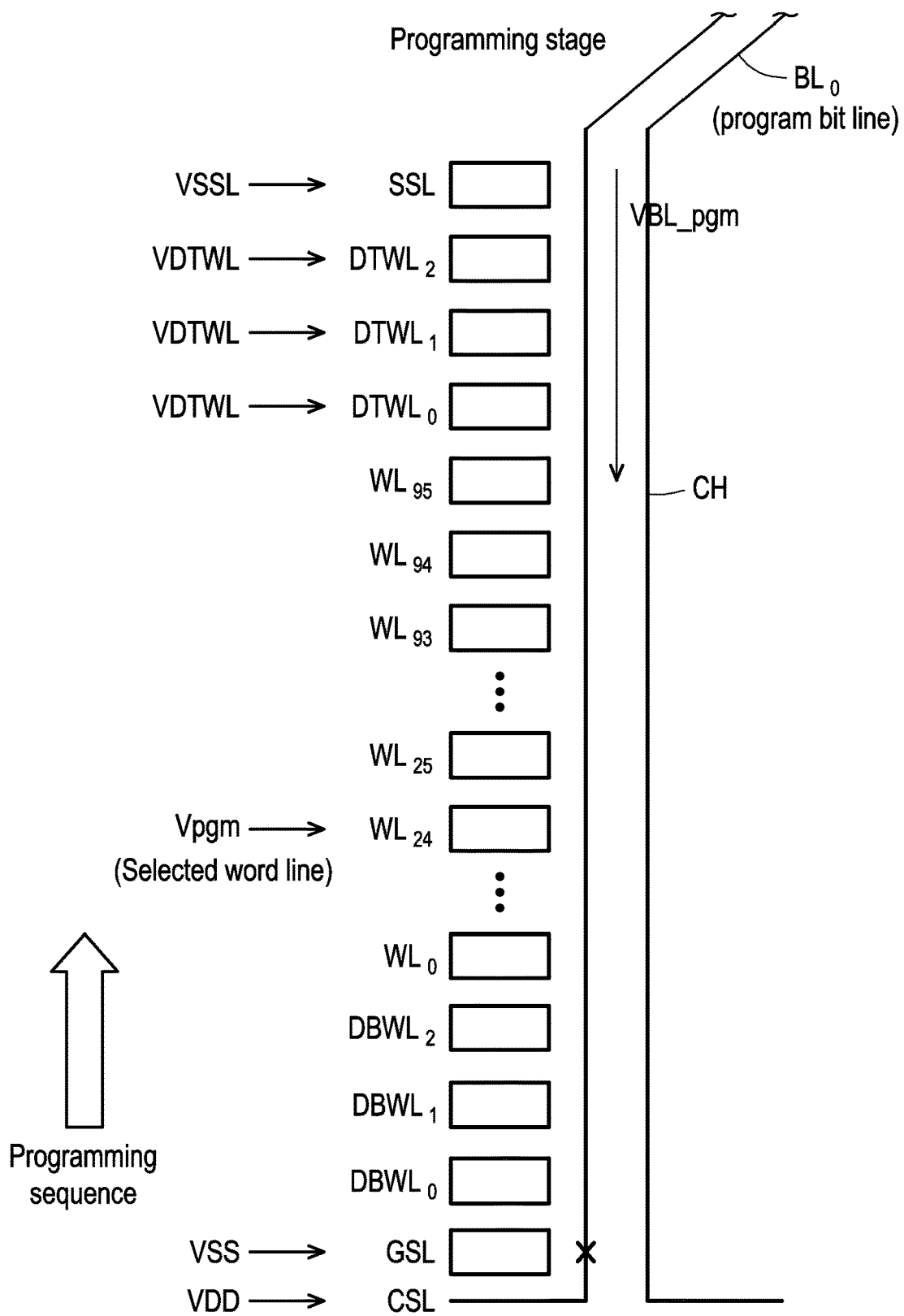
FIGS. 7B-7D show schematic diagrams of applying voltages to the ground select line, the string select line, the common source line, the selected word line, the unselected word lines, and the bit line in a programming stage of one programming shot of another embodiment of the disclosure, wherein the bit line in FIG. 7B is a program bit line, the bit line in FIG. 7C is an inhibit bit line, and the bit line in FIG. 7D is a quick pass write (QPW) bit line.
Figure 7C:
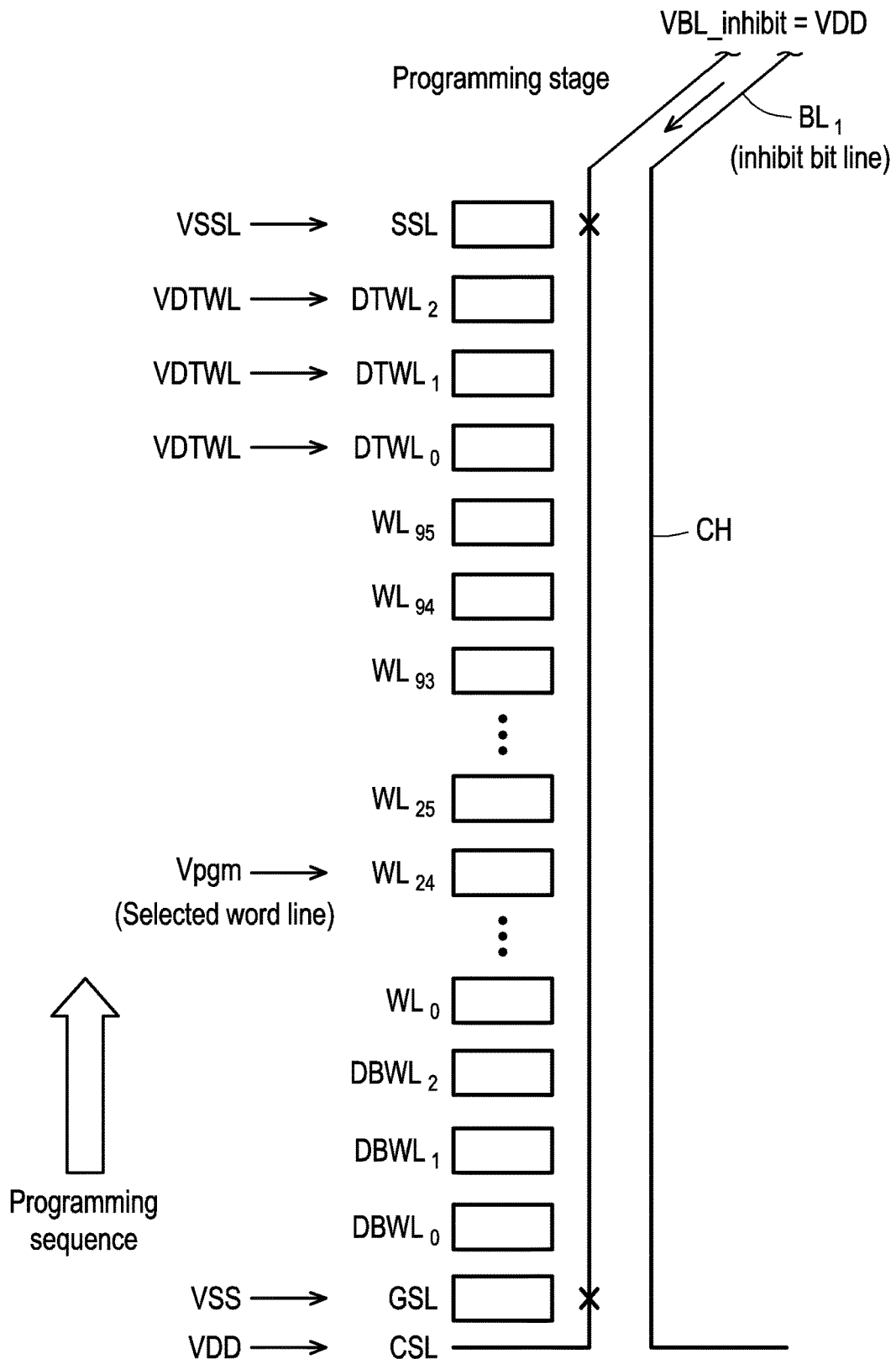
Figure 7D:
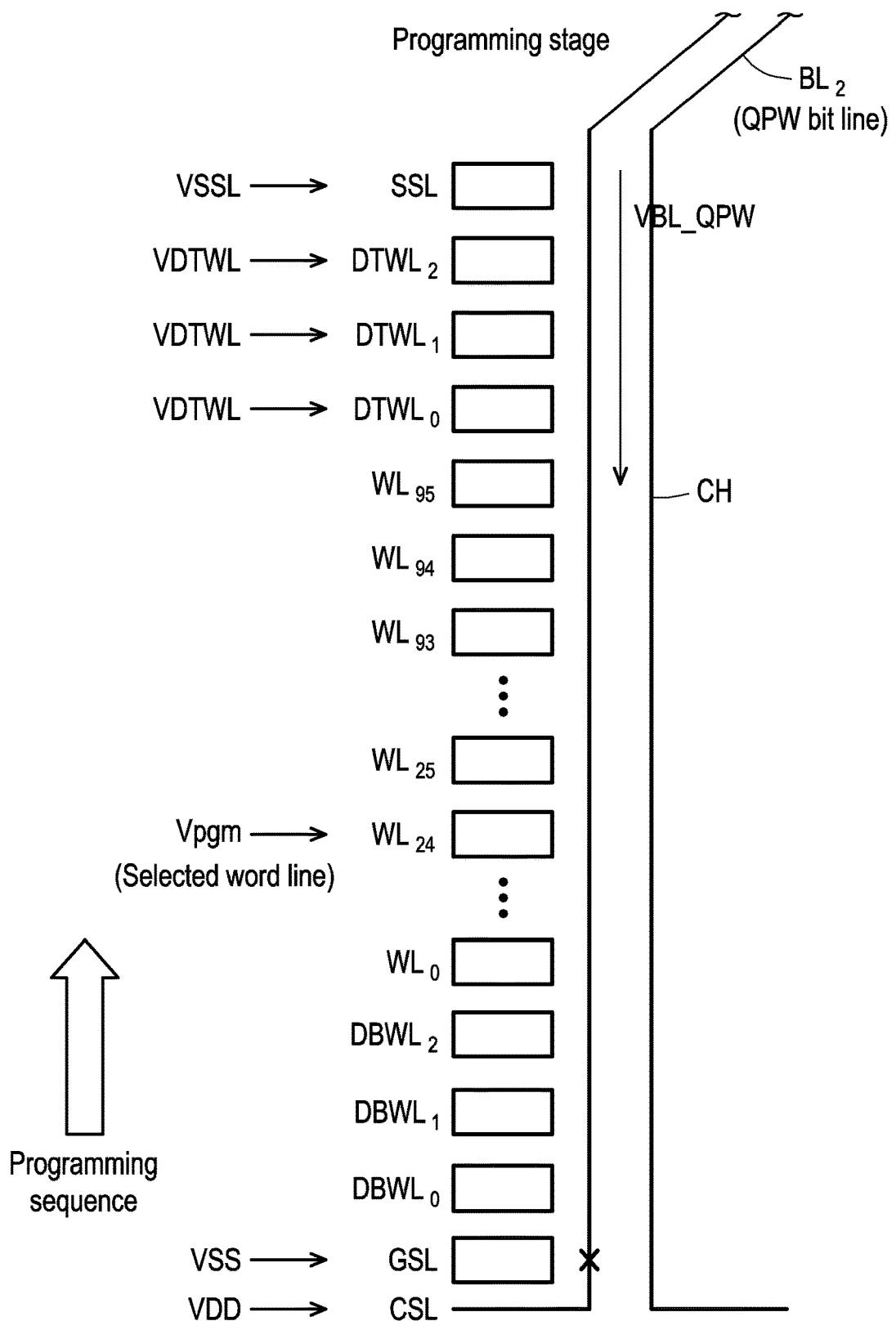

FIGS. 7B-7D show schematic diagrams of a memory applying voltages to the ground select line GSL, the string select line SSL, the common source line CSL, the selected word line, the unselected word lines, and the bit lines $BL_0$-$BL_2$ in a programming stage of one programming shot of another embodiment of the disclosure, wherein the bit line $BL_0$ in FIG. 7B is a program bit line, the bit line $BL_1$ in FIG. 7C is an inhibit bit line, and the bit line $BL_2$ in FIG. 7D is a QPW bit line.

With reference to FIG. 7B, regarding the ground select line GSL, the ground select line GSL keeps the ground voltage VSS in the programming stage. Regarding the string select line SSL, a string select line voltage VSSL is applied to the string select line SSL in the programming stage. Regarding the common source line CSL, the common source line CSL keeps the power supply voltage VDD in the programming stage. Regarding the selected word line (which is the word line $WL_{24}$ in this embodiment) and the unselected word lines (including the plurality of top dummy word lines $DTWL_0$-$DTWL_2$), a programming voltage Vpgm is applied to the selected word line in the programming stage by using incremental-step-pulse programming, and a pass voltage VDTWL is applied to the unselected word line in the programming stage. Regarding the program bit line ($BL_0$), a bit line voltage VBL_pgm is applied to the program bit line ($BL_0$) in the programming stage to perform a programming operation. In detail, when the programming voltage Vpgm is applied to the selected word line, a relatively high voltage difference between the programming voltage Vpgm and the bit line voltage VBL_pgm may cause tunneling of electrons from the channel layer CH to the charge trap layer CTL (shown in FIG. 1B) to be captured thereby.

With reference to FIG. 7C, regarding the ground select line GSL, the ground select line GSL keeps the ground voltage VSS in the programming stage. Regarding the string select line SSL, the string select line voltage VSSL is applied to the string select line SSL in the programming stage. Regarding the common source line CSL, the common source line CSL keeps the power supply voltage VDD in the programming stage. Regarding the selected word line (which is the word line $WL_{24}$ in this embodiment) and the unselected word lines (including the plurality of top dummy word lines $DTWL_0$-$DTWL_2$), the programming voltage Vpgm is applied to the selected word line in the programming stage by using incremental-step-pulse programming, and the pass voltage VDTWL is applied to the unselected word line in the programming stage. Regarding the inhibit bit line ($BL_1$), the inhibit bit line ($BL_1$) keeps the bit line voltage VBL_inhibit in the programming stage, in which the bit line voltage VBL_inhibit could be the power supply voltage VDD to enhance the level of voltage of the channel layer CH, so as to perform a programming inhibit operation.

With reference to FIG. 7D, regarding the ground select line GSL, the ground select line GSL keeps the ground voltage VSS in the programming stage. Regarding the string select line SSL, the string select line voltage VSSL is applied to the string select line SSL in the programming stage. Regarding the common source line CSL, the common source line CSL keeps the power supply voltage VDD in the programming stage. Regarding the selected word line (which is the word line $WL_{24}$ in this embodiment) and the unselected word lines (including the plurality of top dummy word lines $DTWL_0$-$DTWL_2$), the programming voltage Vpgm is applied to the selected word line in the programming stage by using incremental-step-pulse programming, and the pass voltage VDTWL is applied to the unselected word line in the programming stage. Regarding the QPW bit line ($BL_2$), a bit line voltage VBL_QPW is applied to the QPW bit line ($BL_2$) in the programming stage to perform a quick pass write operation.

It is worth noting that, although a three-dimensional memory is taken as an example of the memory 10 of this embodiment, the method of programming a memory of the embodiment of the disclosure may be applied to a two-dimensional memory (e.g., a two-dimensional NAND flash memory). In addition, the method of programming a memory of the embodiment of the disclosure may be applied to a memory cell including a single-level cell (SLC), a multi-level cell (MLC), a triple-level cell (TLC), or a quad-level cell (QLC).

Figure 8:
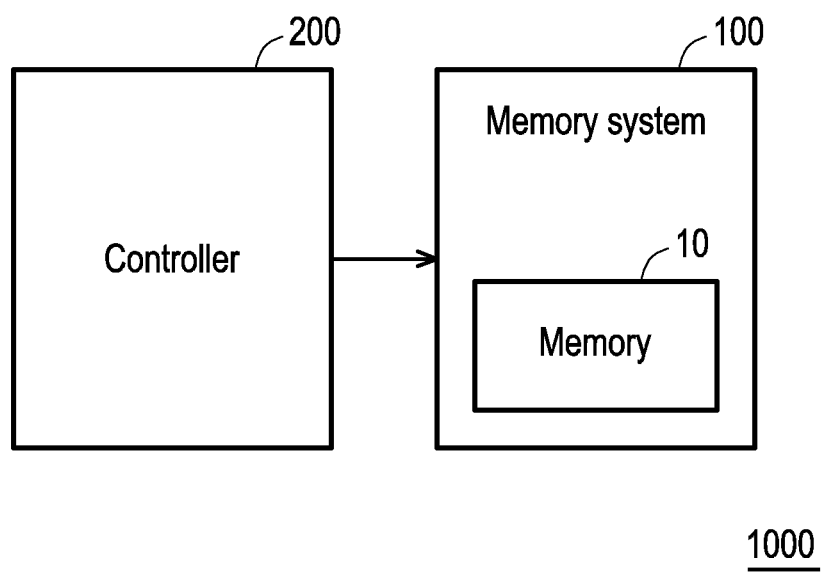
FIG. 8 shows a schematic block diagram of a memory system of an embodiment of the disclosure.

FIG. 8 shows a schematic block diagram of a memory system of an embodiment of the disclosure.

With reference to FIG. 8, in this embodiment, a memory system 1000 includes a memory device 100 and a controller 200.

The memory device 100 may include at least the memory 10 of the embodiments above, for example, but the disclosure is not limited thereto. In other words, the memory device 100 may include a two-dimensional memory or other three-dimensional memories. What is to be described here is that FIG. 8 shows a simplified schematic block diagram only, and those skilled in the art may design an address decoder, a voltage generator, a page buffer, a control logic, and electronic elements with other functions in the memory device 100 as appropriate based on the concept of the disclosure.

The controller 200 is coupled to the memory device 100, for example. The controller 200 may receive a command from a host device (not shown) to control the memory device 100. For example, the controller 200 may be configured to issue a programming command to the memory device 100 to perform a programming operation on the memory 10 in the memory device 100, but the disclosure is not limited thereto.

In other embodiments, the controller 200 may also be configured to issue a read command or an erase command to the memory device 100.

In summary of the foregoing, in the method of programming a memory of the disclosure, by performing the common source line voltage applied to the common source line using ISPP in the plurality of pre-charge stages, the common source line voltage with a relatively low voltage level may be applied in the initial period of the plurality of programming shots (for example, the initial five shots S1 to S5), which prevents generation of a relatively large horizontal electric field on a specific word line (e.g., the selected word line) and induction of hot carrier disturbance.

Furthermore, by applying the common source line voltage to the common source line using ISPP, the common source line voltage with a relatively high voltage level may be applied in the final period of the plurality of programming shots (for example, the last five shots S11 to S15), accordingly ensuring that the channel potential of an unselected memory cell is at a sufficiently large voltage level to prevent generation of the FN tunneling effect in the unselected memory cell and reduce the likelihood of programming disturbance in the memory of the embodiment of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of programming a memory, comprising performing a plurality of programming shots, and each of the plurality of programming shots comprises a pre-charge stage and a programming stage and comprises following steps:
   applying a common source line voltage to a common source line in the pre-charge stage, wherein the common source line voltage is applied by using incremental-step-pulse programming in a plurality of the pre-charge stages; and
   applying a programming voltage to a selected word line in the programming stage, wherein the programming voltage is applied by using incremental-step-pulse programming in a plurality of the programming stages.

2. The method of programming the memory according to claim 1, wherein the common source line voltage in the pre-charge stage is increased between one programming shot and a subsequent programming shot, and each values of the common source line voltage increased between the one programming shot and the subsequent programming shot are the same.

3. The method of programming the memory according to claim 1, wherein the plurality of programming shots comprises a first period and a second period, the common source line voltage in the pre-charge stage is unchanged between one programming shot and a subsequent programming shot of the first period, and the common source line voltage in the pre-charge stage is increased between one programming shot and a subsequent programming shot of the second period.

4. The method of programming the memory according to claim 3, wherein the plurality of programming shots comprise one first period and one second period arranged in sequence, and each values of the common source line voltage between the one programming shot and the subsequent programming shot in the second period are the same.

5. The method of programming the memory according to claim 3, wherein the plurality of programming shots comprise a plurality of first periods and a plurality of second periods, and one of the plurality of second periods is arranged between neighbor two of the plurality of first periods.

6. The method of programming the memory according to claim 3, wherein the plurality of programming shots comprise two first periods and one second period, and the one second period is arranged between the two first periods.

7. The method of programming the memory according to claim 1, further comprising applying a pre-charge voltage to a ground select line and a plurality of bottom dummy word lines in the pre-charge stage.

8. The method of programming the memory according to claim 1, further comprising applying a ground voltage to a string select line in the pre-charge stage to make a string select gate coupled to the string select line in an off state.

9. The method of programming the memory according to claim 1, further comprising performing a quick pass write in the plurality of programming shots.

10. The method of programming the memory according to claim 1, wherein the memory comprises a memory cell including a single-level cell (SLC), a multi-level cell (MLC), a triple-level cell (TLC), or a quad-level cell (QLC).

11. A method of programming a memory, comprising performing a plurality of programming shots, and each of the plurality of programming shots comprises a pre-charge stage and a programming stage and comprises following steps:
    applying a bit line voltage to a bit line in the pre-charge stage, wherein the bit line voltage is applied by using incremental-step-pulse programming in a plurality of the pre-charge stages; and
    applying a programming voltage to a selected word line in the programming stage, wherein the programming voltage is applied by using incremental-step-pulse programming in a plurality of the programming stages.

12. The method of programming the memory according to claim 11, wherein the bit line voltage in the pre-charge stage is increased between one programming shot and a subsequent programming shot, and each values of the bit line voltage between the one programming shot and the subsequent programming shot are the same.

13. The method of programming the memory according to claim 11, wherein the plurality of programming shots comprise a first period and a second period, the bit line voltage in the pre-charge stage is unchanged between one programming shot and a subsequent programming shot of the first period, and the bit line voltage in the pre-charge stage is increased between one programming shot and a subsequent programming shot of the second period.

14. The method of programming the memory according to claim 13, wherein the plurality of programming shots comprise one first period and one second period arranged in sequence, and difference values of the common source line voltage between the one programming shot and the subsequent programming shot in the second period are the same.

15. The method of programming the memory according to claim 13, wherein the plurality of programming shots comprise a plurality of first periods and a plurality of second periods, and one of the plurality of second periods is arranged between neighbor two of the plurality of first periods.

16. The method of programming the memory according to claim 13, wherein the plurality of programming shots comprise two first periods and one second period, and the one second period is arranged between the two first periods.

17. The method of programming the memory according to claim 11, further comprising applying a pre-charge voltage to a string select line and a plurality of top dummy word lines in the pre-charge stage.

18. The method of programming the memory according to claim 11, further comprising applying a ground voltage to a ground select line in the pre-charge stage to make a ground select gate coupled to the ground select line in an off state.

19. The method of programming the memory according to claim 11, further comprising performing a quick pass write in the plurality of programming shots.

20. The method of programming the memory according to claim 11, wherein the memory comprises a memory cell including a single-level cell (SLC), a multi-level cell (MLC), a triple-level cell (TLC), or a quad-level cell (QLC).

* * * * *